US008751991B2

(12) United States Patent
Irie

(10) Patent No.: US 8,751,991 B2
(45) Date of Patent: Jun. 10, 2014

(54) LAYOUT METHOD, LAYOUT SYSTEM, AND NON-TRANSITORY COMPUTER READABLE MEDIUM STORING LAYOUT PROGRAM OF SEMICONDUCTOR INTEGRATED CIRCUIT

(75) Inventor: Kazuyuki Irie, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 48 days.

(21) Appl. No.: 13/099,658

(22) Filed: May 3, 2011

(65) Prior Publication Data
US 2011/0283248 A1 Nov. 17, 2011

(30) Foreign Application Priority Data

May 13, 2010 (JP) ................... 2010-110969

(51) Int. Cl.
*G06F 17/50* (2006.01)
(52) U.S. Cl.
USPC ............................................. 716/119; 326/41
(58) Field of Classification Search
USPC ................ 326/37–38, 41; 716/104, 108, 116, 716/118–122, 126, 128, 132–135, 138
See application file for complete search history.

(56) References Cited

U.S. PATENT DOCUMENTS

| | | | | |
|---|---|---|---|---|
| 6,396,307 B1 * | 5/2002 | Kawakami et al. | ........... | 326/121 |
| 6,412,099 B1 * | 6/2002 | Chiba | ........................... | 716/103 |
| 6,539,536 B1 * | 3/2003 | Singh et al. | .................... | 716/102 |
| 7,127,695 B2 * | 10/2006 | Huang et al. | .................. | 716/103 |
| 7,299,438 B2 | 11/2007 | Hosono | | |
| 7,331,030 B2 * | 2/2008 | Bourgin | ......................... | 716/103 |
| 7,559,040 B1 * | 7/2009 | Albrecht et al. | ............... | 716/132 |
| 8,099,702 B2 * | 1/2012 | Hou et al. | ...................... | 716/131 |
| 2002/0140460 A1 * | 10/2002 | Kawakami et al. | ........... | 326/121 |
| 2006/0109032 A1 | 5/2006 | Hosono | | |
| 2008/0148204 A1 * | 6/2008 | Bueti et al. | ........................ | 716/6 |
| 2010/0031214 A1 * | 2/2010 | Hou et al. | ......................... | 716/9 |

FOREIGN PATENT DOCUMENTS

| | | |
|---|---|---|
| JP | 7-45707 A | 2/1995 |
| JP | 7-182394 A | 7/1995 |
| JP | 2006-154951 A | 6/2006 |
| JP | 2007-80256 A | 3/2007 |

* cited by examiner

*Primary Examiner* — Stacy Whitmore
(74) *Attorney, Agent, or Firm* — Foley & Lardner LLP

(57) ABSTRACT

A layout method of a semiconductor integrated circuit according to the present invention includes selecting M (M is an integer of two or larger and N or smaller) pieces of sequential circuits from N (N is an integer of three or larger) pieces of sequential circuits mounted on the semiconductor integrated circuit, a clock being distributed to the N pieces of sequential circuits from the same clock route; and replacing the M pieces of sequential circuits that are selected with one multi-data input/output sequential circuit including M pieces of input terminals and output terminals and one clock terminal that receives the clock distributed from the clock route.

23 Claims, 17 Drawing Sheets

LAYOUT METHOD, LAYOUT SYSTEM, AND NON-TRANSITORY COMPUTER READABLE MEDIUM STORING LAYOUT PROGRAM OF SEMICONDUCTOR INTEGRATED CIRCUIT

CROSS-REFERENCE TO RELATED APPLICATIONS

This application is based upon and claims the benefit of priority from Japanese patent application No. 2010-110969, filed on May 13, 2010, the disclosure of which is incorporated herein in its entirety by reference.

BACKGROUND

The present invention relates to a layout method, a layout system, and a non-transitory computer readable medium storing a layout program of a semiconductor integrated circuit, and more specifically, to a layout method, a layout system, and a non-transitory computer readable medium storing a layout program of a semiconductor integrated circuit to execute timing analysis based on arrangement wiring information of a sequential circuit.

In recent years, power consumption in layout design has been increasing due to an increase in size of a semiconductor integrated circuit including an ASIC (Application Specific Integrated Circuit), a micon, and an ASSP (Application Specific Standard Produce). Further, influences of OCV (On Chip Variation) are spread along with miniaturization of the process of the semiconductor integrated circuit. Further, an increase in size of the semiconductor integrated circuit makes timing convergence difficult due to the degradation of CTS (Clock Tree Synthesis) skew, which increases design TAT (Turn Around Time). Accordingly, there has been an increasing demand to decrease an area of the layout in the semiconductor integrated circuit, decrease power consumption, and further reduce an OCV value and a CTS skew value.

Japanese Unexamined Patent Application Publication No. 2000-348083 discloses a technique related to a layout method and a layout device of a semiconductor integrated circuit that are capable of suppressing an increase in the layout area and power consumption by reducing skew of the CTS. According to the layout method and the layout device disclosed in Japanese Unexamined Patent Application Publication No. 2000-348083, FFs are re-arranged so that the wiring length of each FF in the CTS final stage becomes an average wiring length distance. Accordingly, insertion of the Delay cell to match the CTS can be suppressed, thereby reducing an area in laying out the semiconductor integrated circuit, power consumption, and OCV target distance.

FIG. 10 is a flow chart showing a process flow of a layout method of a semiconductor integrated circuit according to Japanese Unexamined Patent Application Publication No. 2000-348083. First, a layout device X (not shown) of the semiconductor integrated circuit according to Japanese Unexamined Patent Application Publication No. 2000-348083 arranges FFs that are the layout target (S91). Next, the layout device X arranges and wires the arranged FFs by CTS (S92). This is the normal CTS process.

FIG. 11 is a diagram showing an example of a circuit diagram after CTS process in the layout method of the semiconductor integrated circuit according to Japanese Unexamined Patent Application Publication No. 2000-348083. In the following description, the FF group including the CTS final stage buffer is called a CTS block. In FIG. 11, a CTS block 91 includes a buffer 910 which is a CTS final stage buffer, and FFs 911 to 913 clock-wired from the buffer 910. A CTS block 92 includes a buffer 920 which is a CTS final stage buffer, and FFs 921 to 923 that are clock-wired from the buffer 920. The CTS block includes the CTS blocks 91 to 9n (n is an integer of three or larger).

In this case, the layout device X selects the longest wiring length from the CTS final stage buffer to the FF for each CTS block (S93). For example, the layout device X selects a wiring length L1 from the buffer 910 to the FF 912 as the longest wiring length in the CTS block 91. Further, the layout device X selects a wiring length L2 from the buffer 920 to the FF 921 as the longest wiring length in the CTS block 92. Hereinafter, similarly, the layout device X selects a wiring length Ln from the buffer 9n0 to the FF 9n3 as the longest wiring length in the CTS block 9n.

Then, the layout device X calculates an average value L using the longest wiring length selected in each CTS block (S94). In summary, the layout device X calculates an average value Lavg of the longest wiring length according to the following expression (1).

$$(L1+L2+ \ldots +Ln)/n = Lavg \quad (1)$$

Subsequently, the layout device X re-arranges the FF in the coordinate (x, y) that satisfies the following expression (2) (S95). Specifically, the layout device X re-arranges each FF on sides of the square that satisfies the expression (2) in the two-dimensional coordinate of the x axis and the y axis with the origin of the CTS final stage buffer in each CTS block.

$$L = |x| + |y| \quad (2)$$

Then, the layout device X wires the CTS final stage buffer to each FF that is re-arranged with the minimum distance for each CTS block (S96). Specifically, the layout device X wires the CTS final stage buffer of the origin to each FF by combinations of straight lines parallel to the x axis or the y axis. Accordingly, in Japanese Unexamined Patent Application Publication No. 2000-348083, the wiring length from the final stage buffer to each FF is made closer to the distance of the average wiring length.

FIG. 12 is a diagram describing a concept of arrangement in the layout method of the semiconductor integrated circuit according to Japanese Unexamined Patent Application Publication No. 2000-348083. In the CTS block 91, the lengths of the wiring from the buffer 910 to each of the FFs 911, 912, and 913 shown in solid lines are equal to one another. Similarly, in the CTS block 92, the lengths of the wiring from the buffer 920 to each of the FFs 921, 922, and 923 shown in solid lines are equal to one another.

FIG. 13 is a diagram describing a concept of arrangement in the layout method of the semiconductor integrated circuit according to Japanese Unexamined Patent Application Publication No. 2000-348083. It is assumed that, at origin, a CTS final stage buffer in one CTS block is arranged. Then, the points of average values Lavg of the longest wiring length in the positive and negative directions on the x axis and the y axis are denoted by a, b, c, and d. Connecting the points a, b, c, and d by a dotted line with these points as apices gives a square. The square can be expressed using the expression (2) when a coordinate on a side of the square is expressed by (x, y). Further, L in the first quadrant to the fourth quadrant can be expressed as the following expressions (21) to (24).

$$(\text{First quadrant}) \ L = x + y \quad (21)$$

$$(\text{Second quadrant}) \ L = -x + y \quad (22)$$

$$(\text{Third quadrant}) \ L = -x - y \quad (23)$$

$$(\text{Fourth quadrant}) \ L = x - y \quad (24)$$

For example, when the FF is arranged in the point B (x1, y1) shown in FIG. 13 and wired from the CTS final stage buffer which is the origin with the path of O-A-B, the wiring length is expressed by the following expression (3).

$$OA+AB=x1+y1=Lavg \qquad (3)$$

Similarly, when the FF is arranged in the point E (x2, y2) shown in FIG. 13 and wired from the CTS final stage buffer which is the origin with the path of O-C-D-E, the wiring length is expressed by the following expression (4).

$$OC+CD+DE=(OC+DE)+CD+DE)+CD=|x2|+|y2|=Lavg \qquad (4)$$

Then, the layout device X executes rough wiring (S97), detailed wiring (S98), and verification (S99).

SUMMARY

However, the present inventors have found a problem in the technique of Japanese Unexamined Patent Application Publication No. 2000-348083 that timing convergence is not sufficient. This is because, according to Japanese Unexamined Patent Application Publication No. 2000-348083, it is difficult to make the wiring length from the CTS final stage buffer completely coincide with the average distance due to the restriction of the situation of arrangement around each FF. Even when it is possible to make the wiring length completely coincide with the average distance, it is not necessarily be the optimal timing error for each FF. Accordingly, sufficient timing convergence may not be possible due to the occurrence of skew.

A first aspect of an embodiment of the present invention is a layout method of a semiconductor integrated circuit, including: selecting M (M is an integer of two or larger and N or smaller) pieces of sequential circuits from N (N is an integer of three or larger) pieces of sequential circuits mounted on the semiconductor integrated circuit, a clock being distributed to the N pieces of sequential circuits from the same clock route; and replacing the M pieces of sequential circuits that are selected with one multi-data input/output sequential circuit including M pieces of input terminals and output terminals, and one clock terminal that receives the clock distributed from the clock route.

A second aspect of an embodiment of the present invention is a layout system of a semiconductor integrated circuit using a computer, the computer including: a storage unit that stores arrangement information of N (N is an integer of three or larger) pieces of sequential circuits mounted on the semiconductor integrated circuit, a clock being distributed to the N pieces of sequential circuits from the same clock route; and a control unit that executes layout of the sequential circuits in the semiconductor integrated circuit, in which the control unit includes: a selection means that selects M (M is an integer of two or larger and N or smaller) pieces of sequential circuits from the N pieces of sequential circuits; and a replacement means that replaces the M pieces of sequential circuits that are selected with one multi-data input/output sequential circuit including M pieces of input terminals and output terminals and one clock terminal that receives a clock distributed from the clock route.

A third aspect of an embodiment of the present invention is a non-transitory computer readable medium storing a layout program of a semiconductor integrated circuit that makes a computer to execute processing including: selection processing that selects M (M is an integer of two or larger and N or smaller) pieces of sequential circuits from N (N is an integer of three or larger) pieces of sequential circuits mounted on the semiconductor integrated circuit, a clock being distributed to the N pieces of sequential circuits from the same clock route; and replacement processing that replaces the M pieces of sequential circuits that are selected with one multi-data input/output sequential circuit including M pieces of input terminals and output terminals and one clock terminal that receives the clock distributed from the clock route.

As described above, according to the first to third exemplary aspects of the present invention, the M pieces of sequential circuits are replaced with a multi-data input/output sequential circuit such as one multi-bit flip-flop or the like. Before replacement, the clock is distributed to each of the plurality of different sequential circuits from the same clock route, which easily causes timing error. Meanwhile, after the replacement is executed according to the present invention, it is possible to suppress the delay of the clock by integrating the inputs of clocks while achieving data processing equivalent to that in the plurality of sequential circuits. Accordingly, the occurrence of skew can be minimized, thereby enabling efficient performance of timing convergence.

According to the present invention, it is possible to provide a layout method, a layout system, and a non-transitory computer readable medium storing a layout program of a semiconductor integrated circuit that improves timing convergence.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

In the following description, specific embodiments of the present invention will be described in detail with reference to the accompanying drawings. Throughout the drawings, the same components are denoted by the same reference symbols, and overlapping description will be omitted as appropriate for the sake of clarity.

<First Embodiment>

Figure 1:
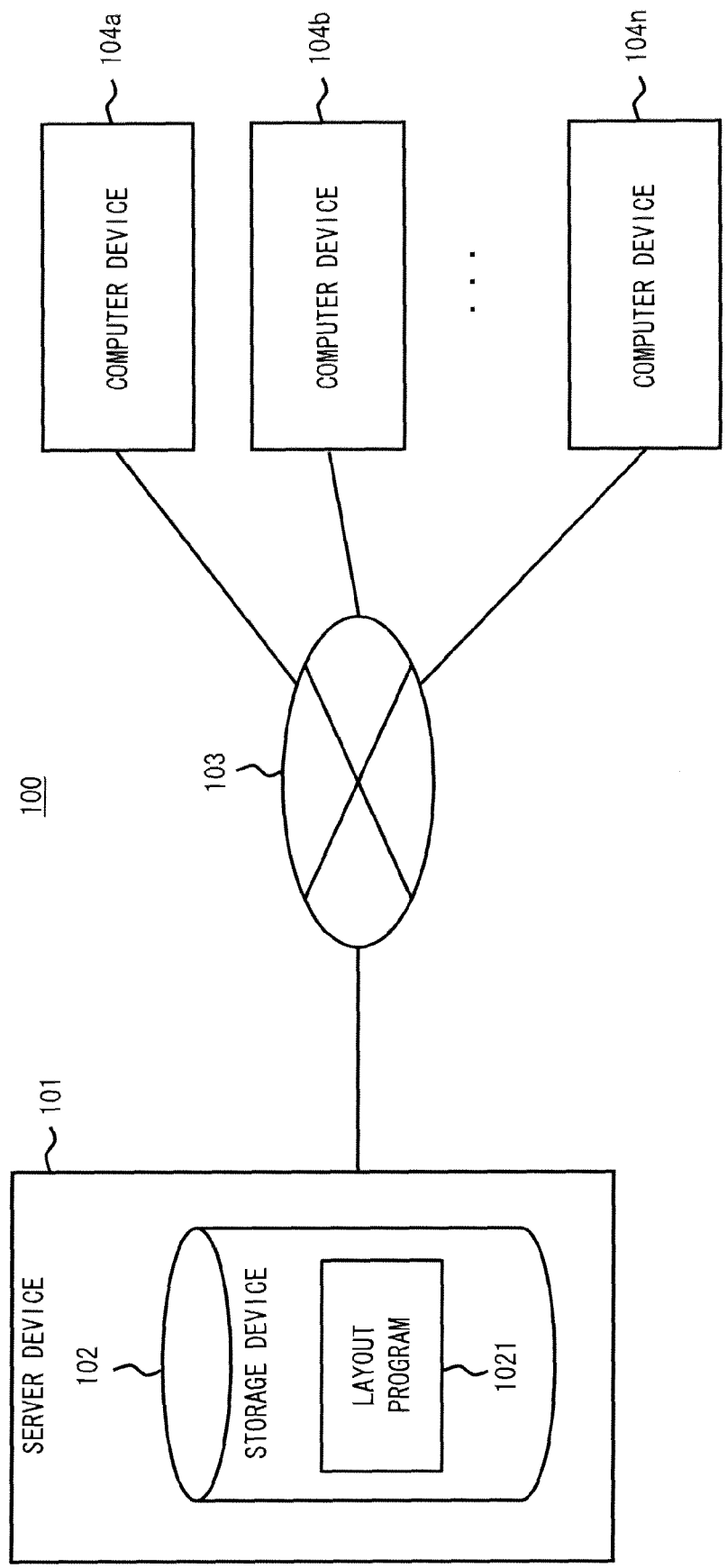
FIG. 1 is a block diagram showing a configuration of an information system that executes a layout method of a semiconductor integrated circuit according to a first embodiment of the present invention.

FIG. 1 is a block diagram showing a configuration of a layout system 100 that executes a layout method of a semiconductor integrated circuit according to a first embodiment of the present invention. The layout system 100 is a computer system that includes a server device 101 and computer devices 104a, 104b, . . . , 104n connected through a network 103. The network 103 is a communication network such as the Internet, an intranet, a public network, a dedicated line or the like.

The server device 101 is a computer device that includes a storage device 102. Since the other configurations and operations of the server device 101 are already known, they are not specifically illustrated in the drawings or described in detail. The storage device 102 stores at least a layout program 1021. The storage device 102 may be a storage medium or a non-volatile storage device (e.g., a hard disk drive, a flash memory), or may be a volatile storage device (e.g., DRAM (Dynamic Random Access Memory)). The server device 101 connects with the computer devices 104a to 104n, which are client terminals, through the network 103. The server device 101 provides the layout program 1021 stored in the storage device 102 to a request source through the network 103 in response to a request from one of the computer devices 104a to 104n.

The computer devices 104a to 104n achieve layout processing of the semiconductor integrated circuit according to the first embodiment of the present invention by acquiring the layout program 1021 from the server device 101, storing it in each storage device (not shown) included therein, and executing the program. The computer devices 104a to 104n serve as an engineering work station, for example.

Note that the first embodiment of the present invention is not limited to the computer system such as the layout system 100 as shown in FIG. 1. For example, the layout system 100 according to the first embodiment of the present invention may be implemented by a single computer device. This may be realized by storing a layout program 152 in the computer device 104a in advance, for example.

Figure 2:
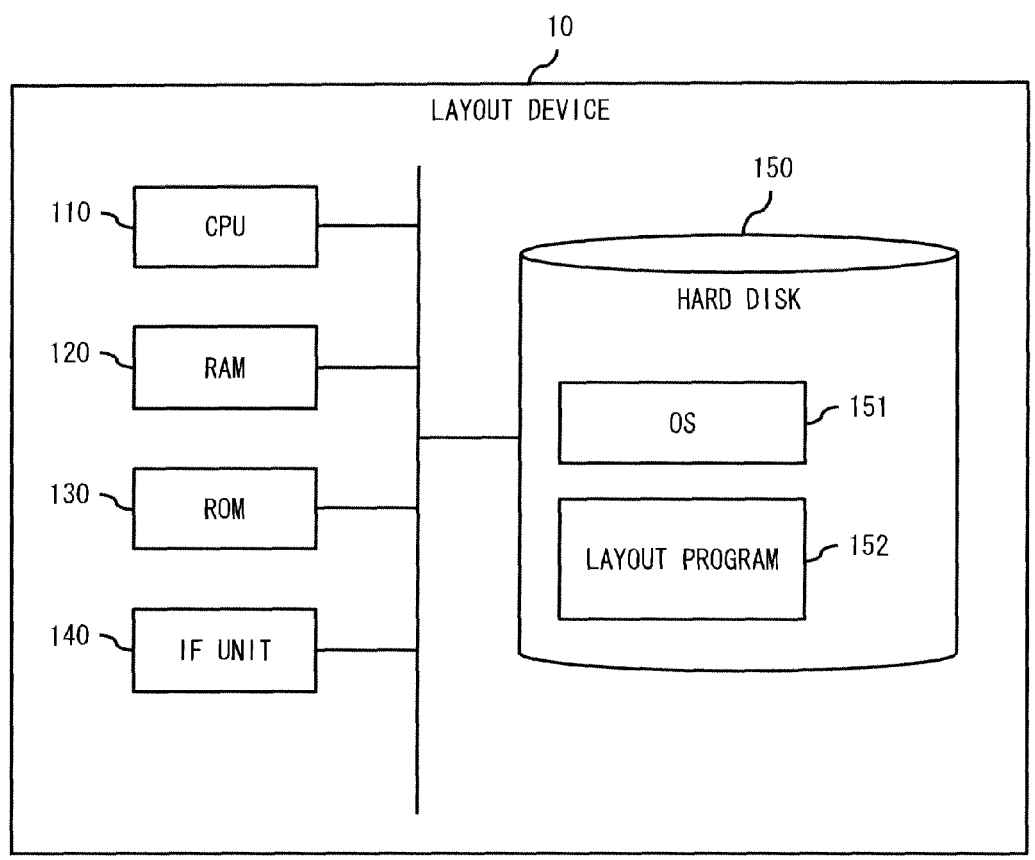
FIG. 2 is a block diagram showing a hardware configuration of a layout device that executes the layout method of the semiconductor integrated circuit according to the first embodiment of the present invention.

FIG. 2 is a block diagram showing a hardware configuration of the layout device 10 that executes the layout method of the semiconductor integrated circuit according to the first embodiment of the present invention by a single computer device. The layout device 10 is a computer device that includes a CPU (Central Processing Unit) 110, a RAM (Random Access Memory) 120, a ROM (Read Only Memory) 130, an IF (Interface) unit 140, and a hard disk 150. Further, the hard disk 150 is a non-volatile storage device, and stores an OS (Operating System) 151 and a layout program 152. Note that information regarding the layout and a computer program for performing CTS or timing analysis may be stored in the hard disk 150. The information regarding the layout includes, for example, arrangement information and wiring information of sequential circuits such as flip-flops mounted on the semiconductor integrated circuit which is the layout target.

The CPU 110 is a control device that controls various processing in the layout device 10, access to the RAM 120, the ROM 130, the IF unit 140, the hard disk 150 and the like. The IF unit 140 performs data input/output between the layout device 10 and external devices. In the layout device 10, the CPU 110 reads and executes the OS 151, the layout program 152 and the like stored in the hard disk 150. Accordingly, the layout device 10 achieves the layout processing of the semiconductor integrated circuit.

Figure 3:
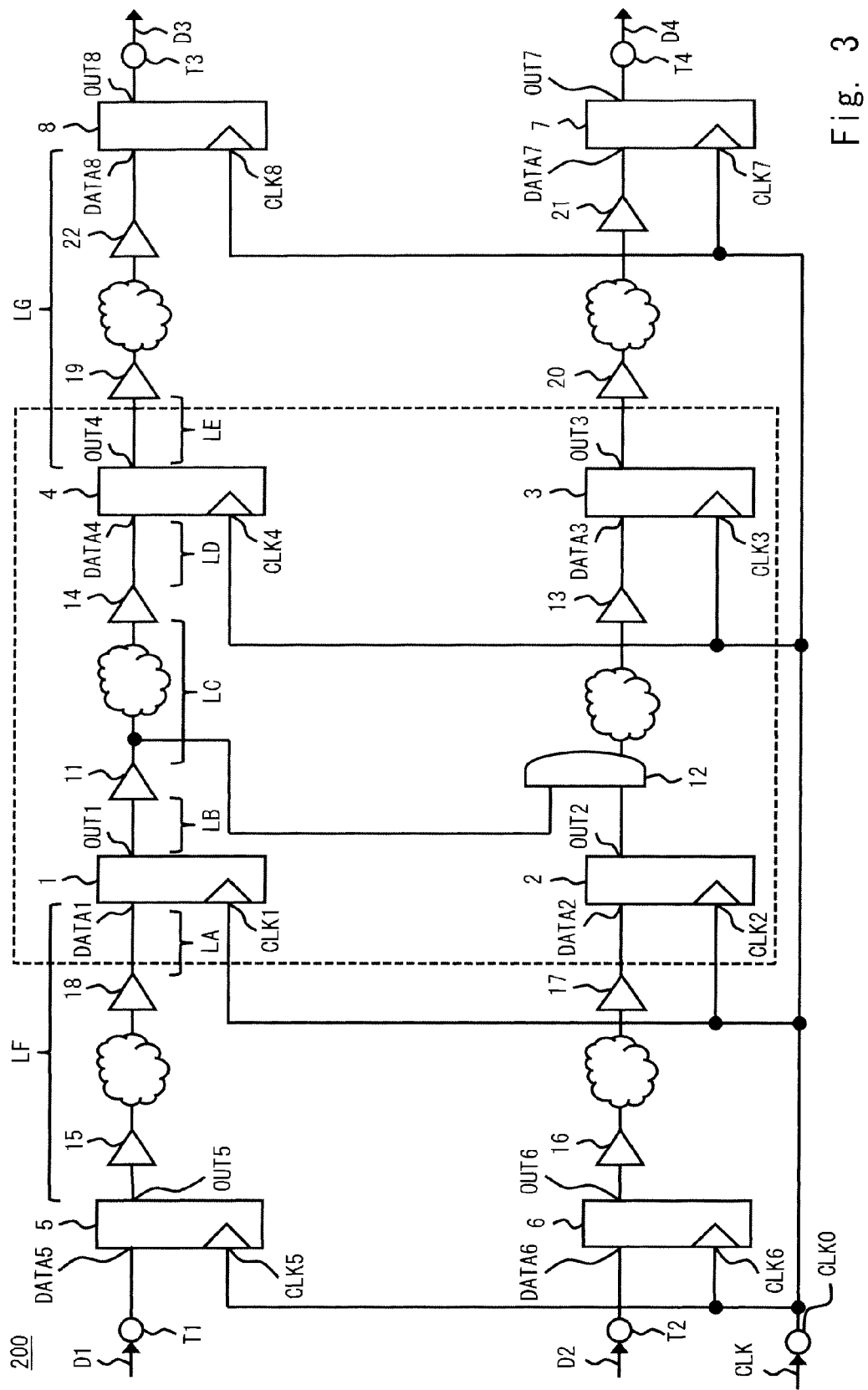
FIG. 3 is a diagram showing an example of a circuit diagram to which the layout method of the semiconductor integrated circuit according to the first embodiment of the present invention is applied.

FIG. 3 is a diagram showing an example of a circuit diagram of a semiconductor integrated circuit 200 to which the layout method of the semiconductor integrated circuit according to the first embodiment of the present invention is applied. The semiconductor integrated circuit 200 has an input terminal T1 that receives an external data signal D1, an input terminal T2 that receives an external data signal D2, and a clock input terminal CLK0 that receives a clock signal CLK supplied through a clock route. Further, the semiconductor integrated circuit 200 externally outputs a data signal D3 from an output terminal T3, and externally outputs a data signal D4 from an output terminal T4. Further, FF1 to FF8 mounted on the semiconductor integrated circuit 200 are flip-flop circuits that are one example of sequential circuits that include input terminals DATA1 to DATA8 that receive one-bit data, output terminals OUT1 to OUT8 to output one-bit data, and clock input terminals CLK1 to CLK8 that receive a clock signal CLK distributed from the same clock route.

Now, the connection relation of circuit elements of the semiconductor integrated circuit 200 shown in FIG. 3 will be described. The FF5 has the input terminal DATA5 connected to the input terminal T1, and the output terminal OUT5 connected to an input terminal of a latter-stage cell 15. Further, the FF5 has the clock input terminal CLK5 connected to the clock input terminal CLK0. The cell 15 has an output terminal connected to an input terminal of a cell 18 located at the previous stage of the FF1 through a combinational circuit. The cell 18 has an output terminal connected to the input terminal DATA1 of the FF1.

The FF1 has the output terminal OUT1 connected to an input terminal of a subsequent-stage cell 11. Further, the FF1 has the clock input terminal CLK1 connected to the clock input terminal CLK0.

The FF6 has the input terminal DATA6 connected to the input terminal T2, and the output terminal OUT6 connected to an input terminal of a subsequent-stage cell 16. Further, the FF6 has the clock input terminal CLK6 connected to the clock input terminal CLK0. The cell 16 has an output terminal connected to an input terminal of a cell 17 that is located at the previous stage of the FF2 through a combinational circuit. The cell 17 has an output terminal connected to the input terminal DATA2 of the FF2.

The FF2 has the output terminal OUT2 connected to one of input terminals of a subsequent-stage cell 12. Further, the FF2 has the clock input terminal CLK2 connected to the clock input terminal CLK0.

The cell 11 has an output terminal connected to an input terminal of a cell 14 that is located at the previous stage of the FF4 through a combinational circuit, and to one of input terminals of the cell 12. The cell 14 has an output terminal connected to the input terminal DATA4 of the FF4. The FF4 has the output terminal OUT4 connected to an input terminal of a subsequent-stage cell 19. Further, the FF4 has the clock input terminal CLK4 connected to the clock input terminal CLK0.

The cell 12 has an output terminal connected to an input terminal of a cell 13 that is located at the previous stage of the FF3 through a combinational circuit. The cell 13 has an output terminal connected to the input data DATA3 of the FF3. The FF3 has the output terminal OUT3 connected to an input terminal of a subsequent-stage cell 20. Further, the FF3 has the clock input terminal CLK3 connected to the clock input terminal CLK0.

The cell 19 has an output terminal connected to an input terminal of a cell 22 that is located at the previous stage of the FF8 through a combinational circuit. The cell 22 has an output terminal connected to the input terminal DATA8 of the FF8. The FF8 has the output terminal OUT8 connected to the output terminal T3. The FF8 further has the clock input terminal CLK8 connected to the clock input terminal CLK0.

The cell 20 has an output terminal connected to an input terminal of a cell 21 that is located at the previous stage of the FF7 through a combinational circuit. The cell 21 has an output terminal connected to the input terminal DATA7 of the FF7. The FF7 has the output terminal OUT7 connected to the output terminal T4. Further, the FF7 has the clock input terminal CLK7 connected to the clock input terminal CLK0.

Figure 4:
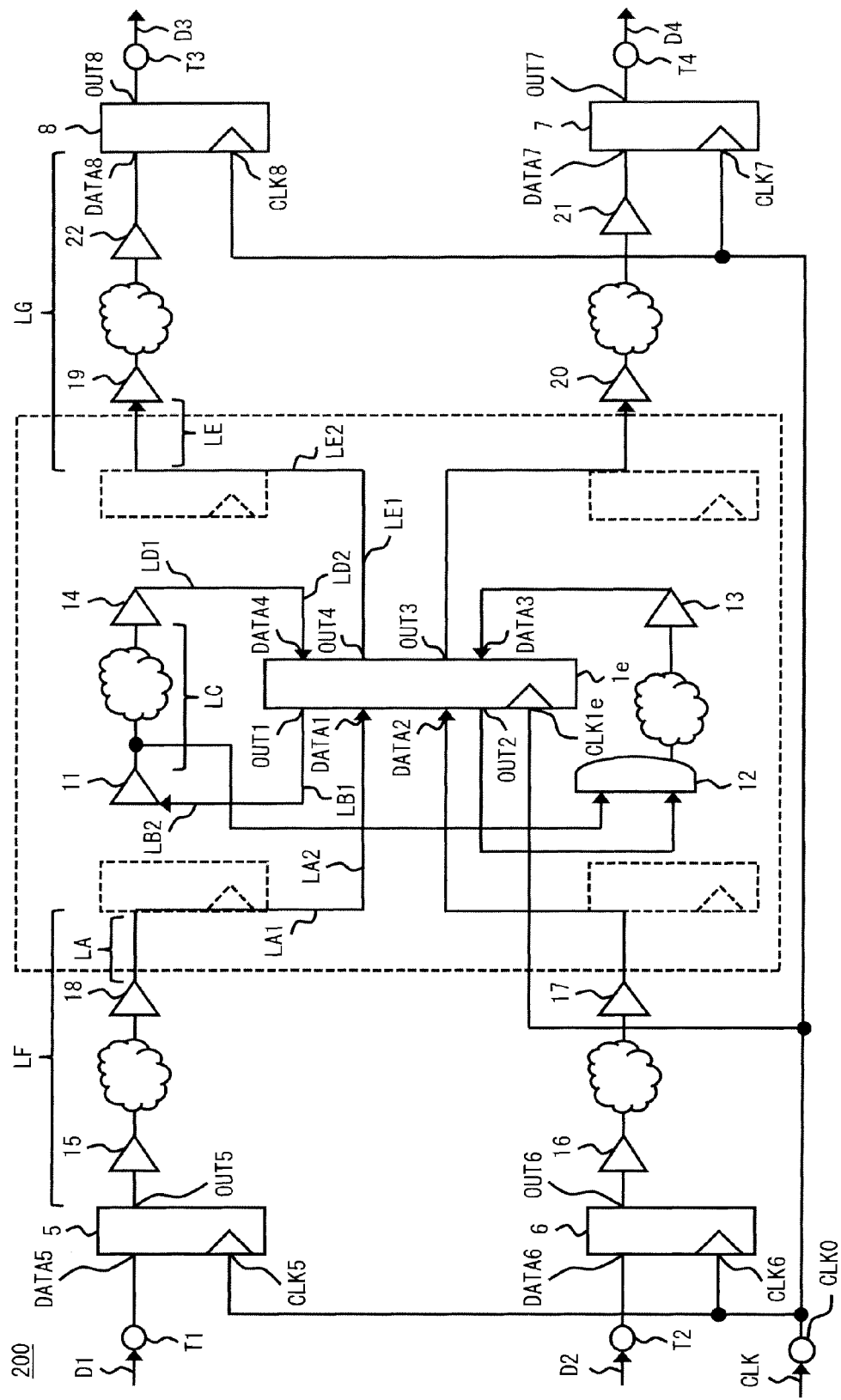
FIG. 4 is a diagram showing an example of a circuit diagram after the layout method of the semiconductor integrated circuit according to the first embodiment of the present invention is applied.

FIG. 4 is a diagram showing an example of a circuit diagram of the semiconductor integrated circuit 200 after the layout method of the semiconductor integrated circuit according to the first embodiment of the present invention is applied. Specifically, in FIG. 4, four cells of FF1, FF2, FF3, and FF4 of FIG. 3 are replaced with an FF1e. The FF1e is a multi-bit flip-flop circuit which is an example of a sequential circuit that receives an input of one clock signal, receives an input of four-bit data, and outputs four-bit data. More specifically, the FF1e includes four input terminals DATA1 to DATA4 that receive the input of one-bit data, four output terminals OUT1 to OUT4 that output one-bit data, and one clock input terminal CLK1e that receives a distributed clock signal CLK. In other words, the FF1e is one multi-data input/output sequential circuit that includes input terminals and output terminals having the same number as the FF1 to FF4 that are the replacement target, and one clock terminal that receives a clock distributed from a clock route. In FIG. 4, the configurations of the FF5, the cell 15, the FF6, the cell 16, the cell 22, the FF8, the cell 21, and the FF7 are the same to those shown in FIG. 3, and thus description thereof will be omitted.

Now, the connection relation of the circuit elements of the semiconductor integrated circuit 200 shown in FIG. 4 will be described. The FF1e has the input terminal DATA1 connected to the output terminal of the cell 18, the input terminal DATA2 connected to the output terminal of the cell 17, the input terminal DATA3 connected to the output terminal of the cell 13, and the input terminal DATA4 connected to the output terminal of the cell 14. Further, the FF1e has the output terminal OUT1 connected to the input terminal of the cell 11 the output terminal OUT2 connected to one of input terminals of the cell 12, the output terminal OUT3 connected to the input terminal of the cell 20, and the output terminal OUT4 connected to the input terminal of the cell 19. Further, the FF1e has the clock input terminal CLK1e connected to the clock input terminal CLK0.

The cell 11 has the output terminal connected to the input terminal of the cell 14 through a combinational circuit and to one of input terminals of the cell 12. The cell 14 has the output terminal connected to the input terminal DATA4 of the FF1e. The cell 12 has the output terminal connected to the input terminal of the cell 13 through a combinational circuit. The cell 13 has the output terminal connected to the input terminal DATA3 of the FF1e. Further, each of the cells 11 to 14 of FIG. 4 has the same type as the cells 11 to 14 shown in FIG. 3, and is arranged in the same arrangement coordinate.

Referring now to FIGS. 3 and 4, an example of replacement with the multi-bit FF circuit in the layout method of the semiconductor integrated circuit according to the first embodiment of the present invention will be described. First, the arrangement distance in FIG. 3 will be described. A distance LA indicates the distance between the cell 18 and the FF1 based on the arrangement coordinates. Further, a distance LB indicates the distance between the FF1 and the cell 11 based on the arrangement coordinates. A distance LC indicates the distance between the cell 11 and the cell 14 based on the arrangement coordinates. A distance LD indicates the distance between the cell 14 and the FF4 based on the arrangement coordinates. A distance LE indicates the distance between the FF4 and the cell 19 based on the arrangement coordinates. A distance LIT indicates the distance between the FF5 and the FF1 based on the arrangement coordinates. A distance LG indicates the distance between the FF4 and the FF8 based on the arrangement coordinates.

An example of replacement according to the first embodiment of the present invention includes replacing the four flip-flop circuits of the FF1, the FF2, the FF3, and the FF4 shown in FIG. 3 with one multi-bit FF circuit shown in the FF1e in FIG. 4. In the replacement processing, the arrangement positions of the cell 11, the cell 12, the cell 13, the cell 14, the cell 17, the cell 18, the cell 19, and the cell 20 are not changed.

At this time, the arrangement distances are changed from FIG. 3 to FIG. 4 by the replacement processing. For example, the arrangement distances between cells or FFs from the cell 18 to the cell 19 through the FF1, the cell 11, the cell 14, and the FF4 are changed as follows except the distance LC. More specifically, while the arrangement distance from the cell 18 to the input terminal DATA1 of the FF1 is the distance LA in FIG. 3, the arrangement distance from the cell 18 to the input terminal DATA1 of the FF1e is "distance LA+distance LA1+distance LA2" in FIG. 4. Further, while the arrangement distance from the output terminal OUT1 of the FF1 to the cell 11 is the distance LB in FIG. 3, the arrangement distance from the output terminal OUT1 of the FF1e to the cell 11 is "distance LB1+distance LB2" in FIG. 4. Further, while the arrangement distance from the cell 14 to the input terminal DATA4 of the FF4 is the distance LD in FIG. 3, the arrangement distance from the cell 14 to the input terminal DATA4 of the FF1e is "distance LD1+distance LD2" in FIG. 4. Further, while the arrangement distance from the output terminal OUT4 of the FF4 to the cell 19 is the distance LE in FIG. 3, the arrangement distance from the output terminal OUT4 of the FF1e to the cell 19 is "distance LE1+distance LE2+distance LE" in FIG. 4.

The arrangement distances between cells or FFs from the cell 17 to the cell 20 through the FF2, the cell 12, the cell 13, and the FF3 changes in the similar way except the area between the cell 12 and the cell 13.

Figure 5:
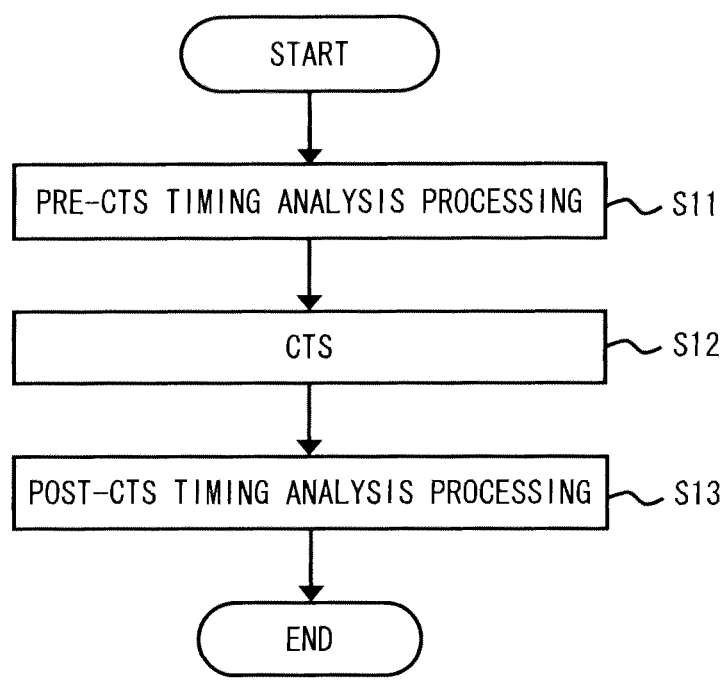
FIG. 5 is a flow chart showing a flow of processing of the layout method of the semiconductor integrated circuit according to the first embodiment of the present invention.
Figure 6A:
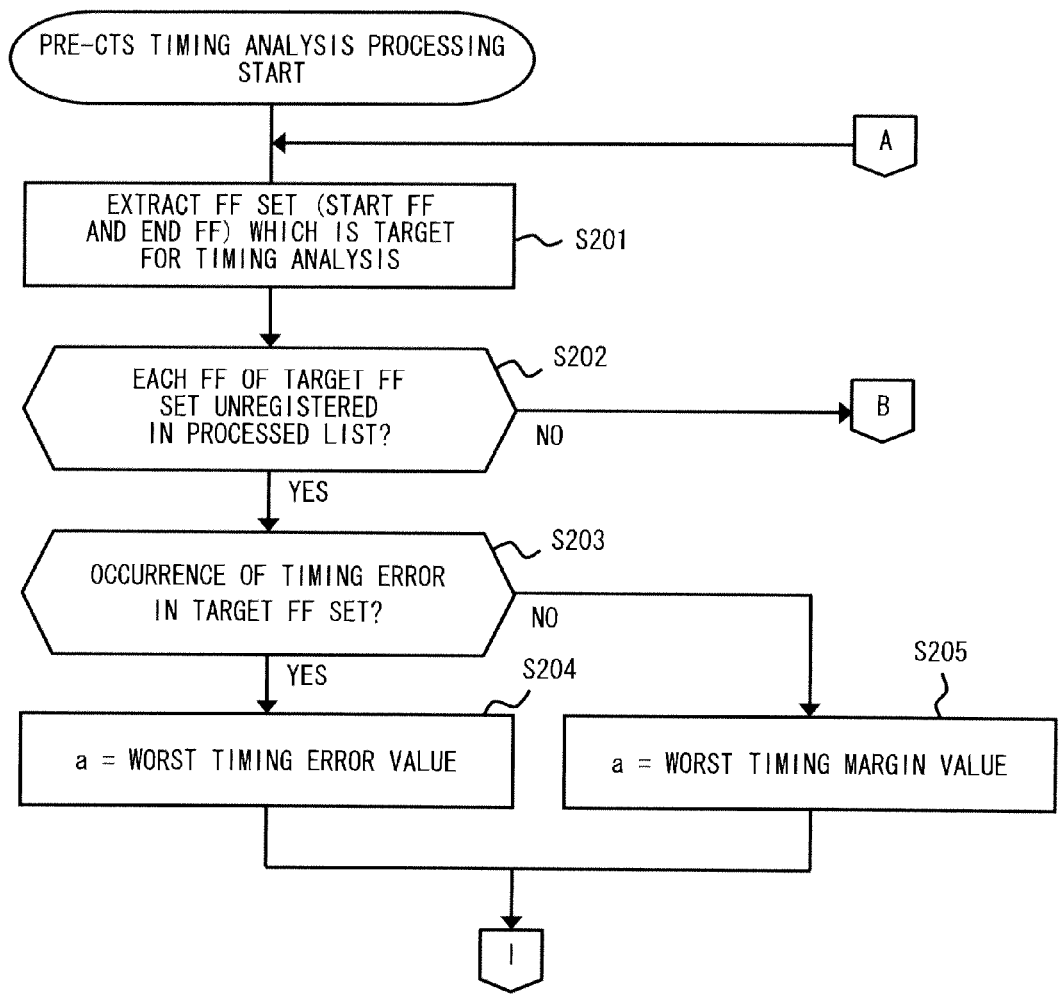
FIG. 6A is a flow chart showing a flow of pre-CTS timing analysis processing (1/4) according to the first embodiment of the present invention.
Figure 6B:
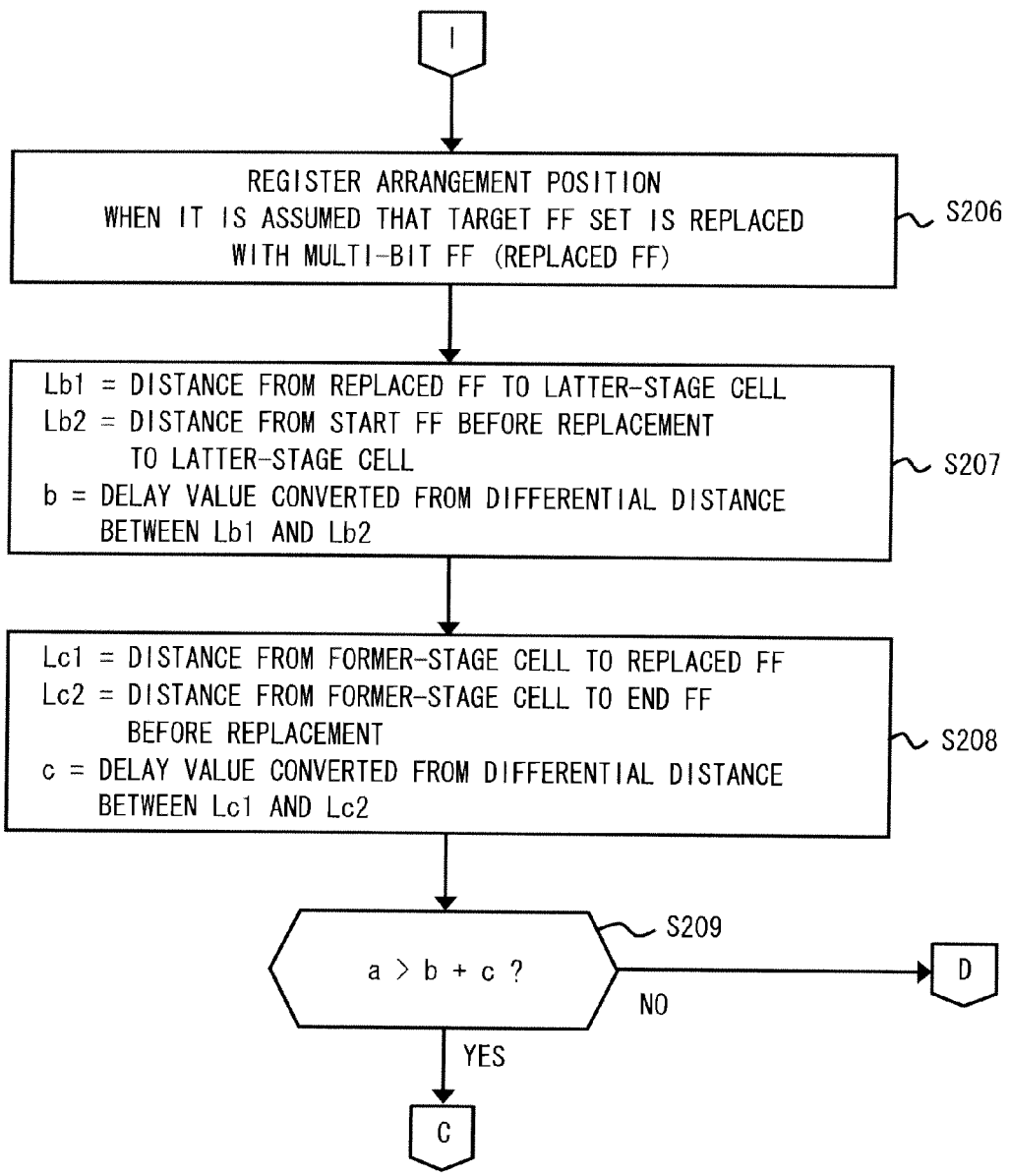
FIG. 6B is a flow chart showing a flow of pre-CTS timing analysis processing (2/4) according to the first embodiment of the present invention.
Figure 7A:
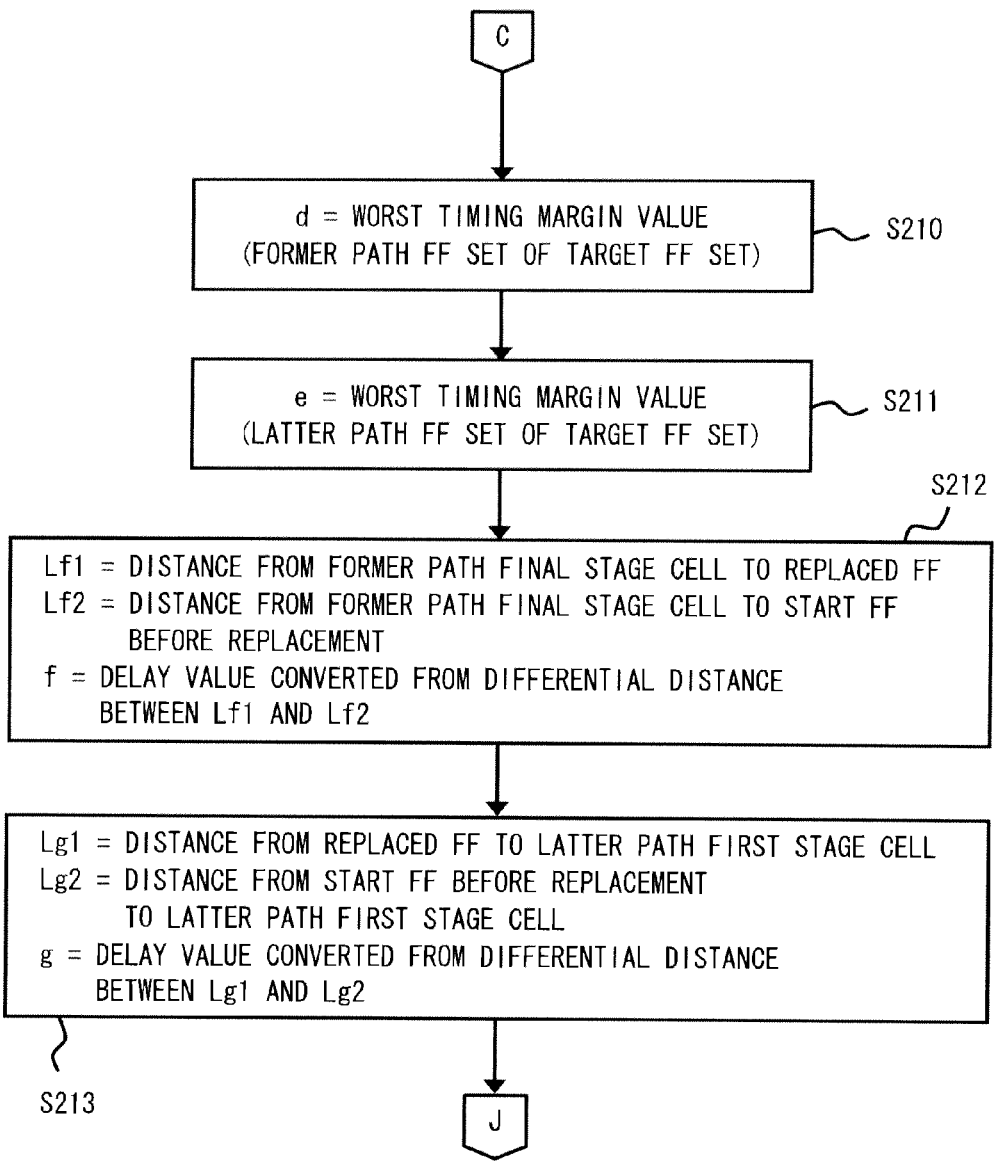
FIG. 7A is a flow chart showing a flow of pre-CTS timing analysis processing (3/4) according to the first embodiment of the present invention.
Figure 7B:
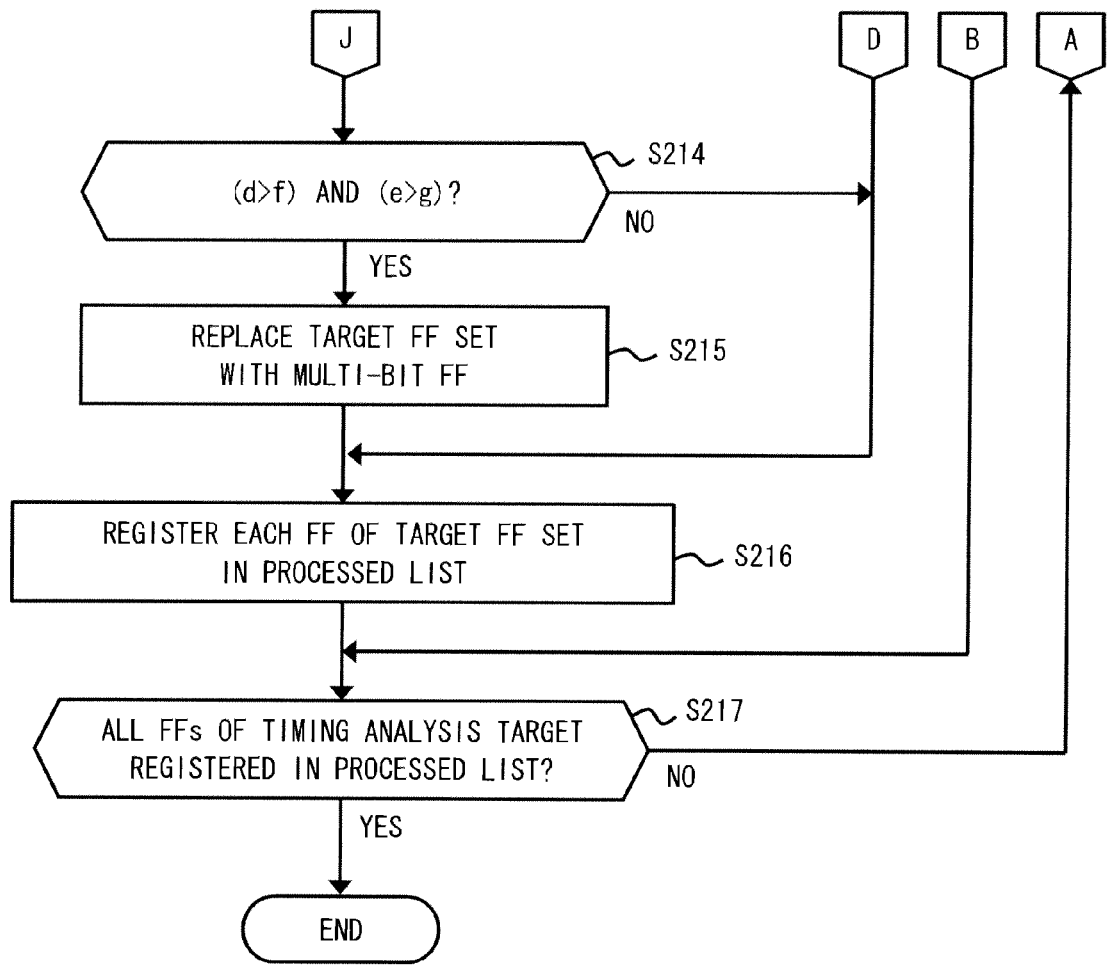
FIG. 7B is a flow chart showing a flow of pre-CTS timing analysis processing (4/4) according to the first embodiment of the present invention.
Figure 8A:
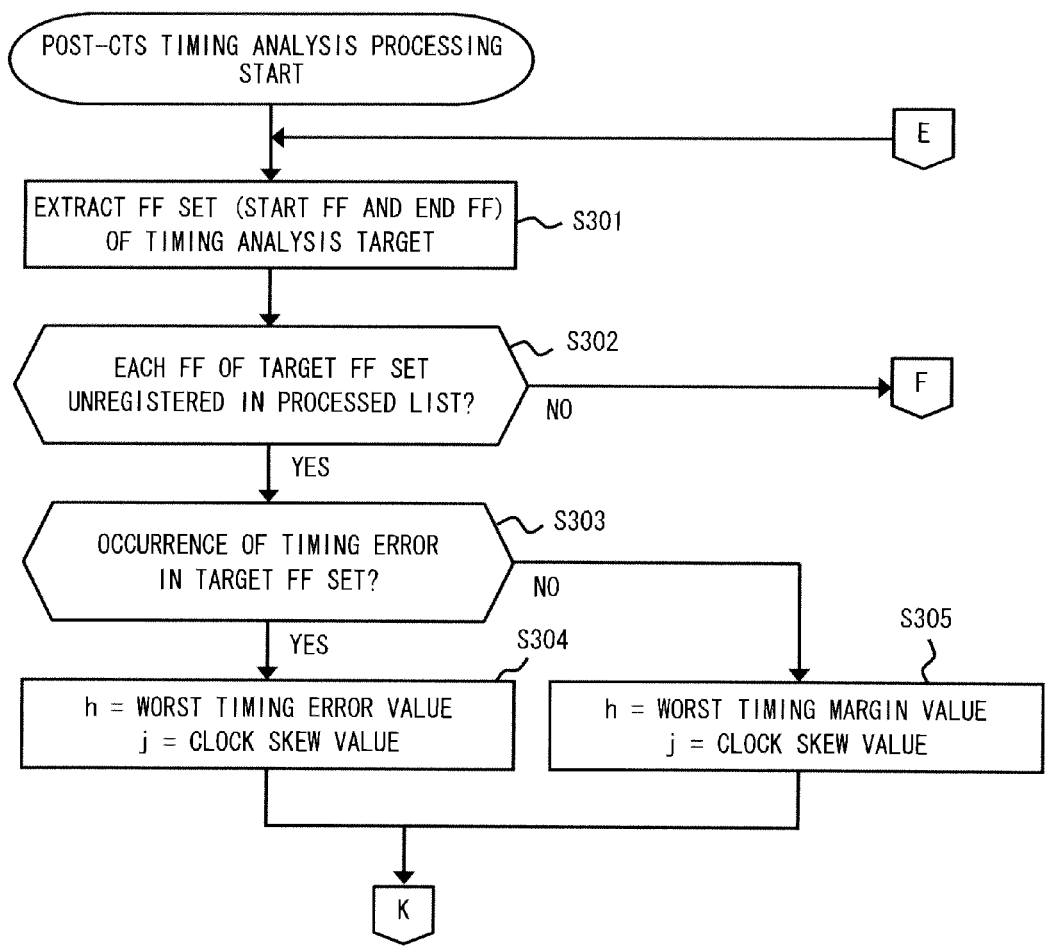
FIG. 8A is a flow chart showing a flow of post-CTS timing analysis processing (1/4) according to the first embodiment of the present invention.
Figure 8B:
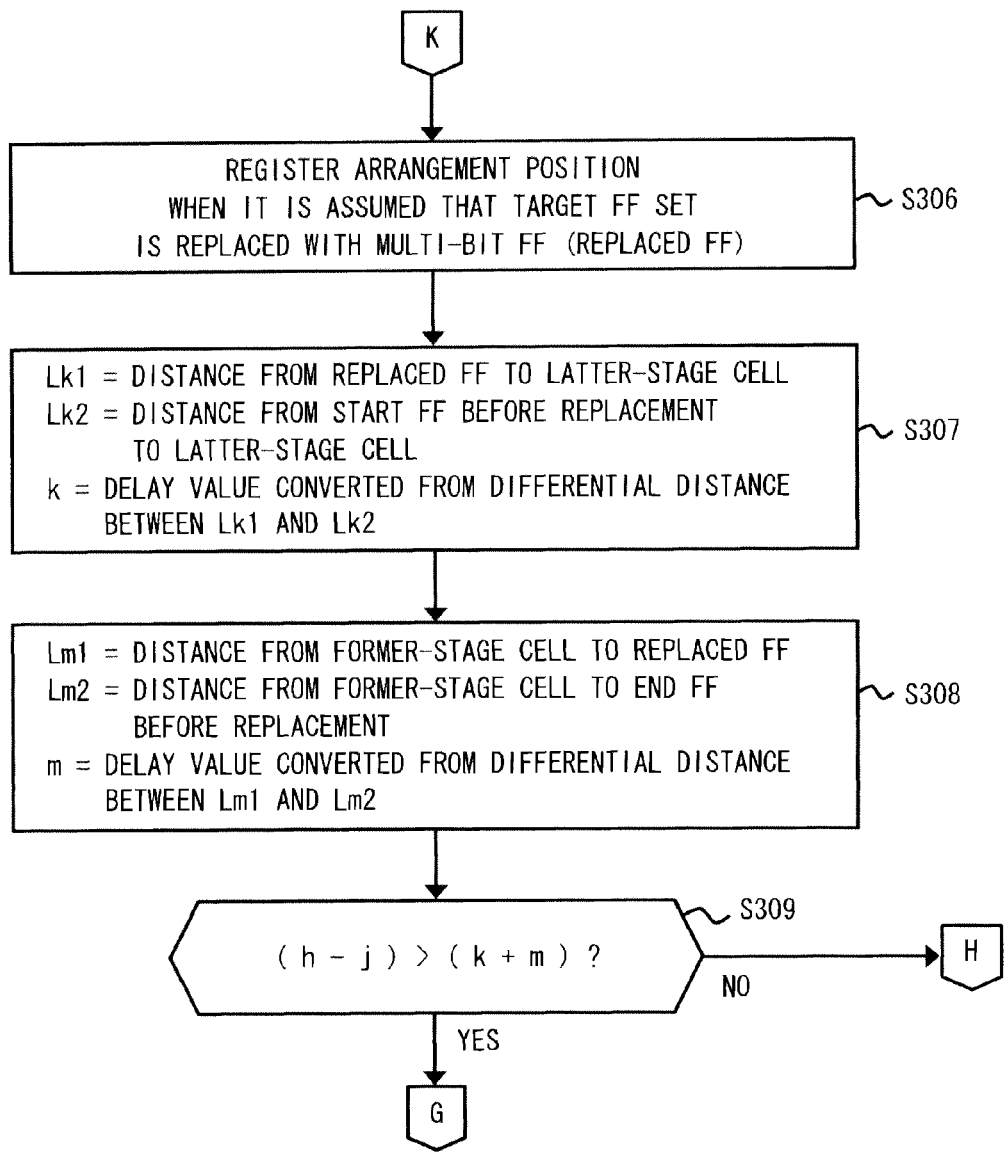
FIG. 8B is a flow chart showing a flow of post-CTS timing analysis processing (2/4) according to the first embodiment of the present invention.
Figure 9A:
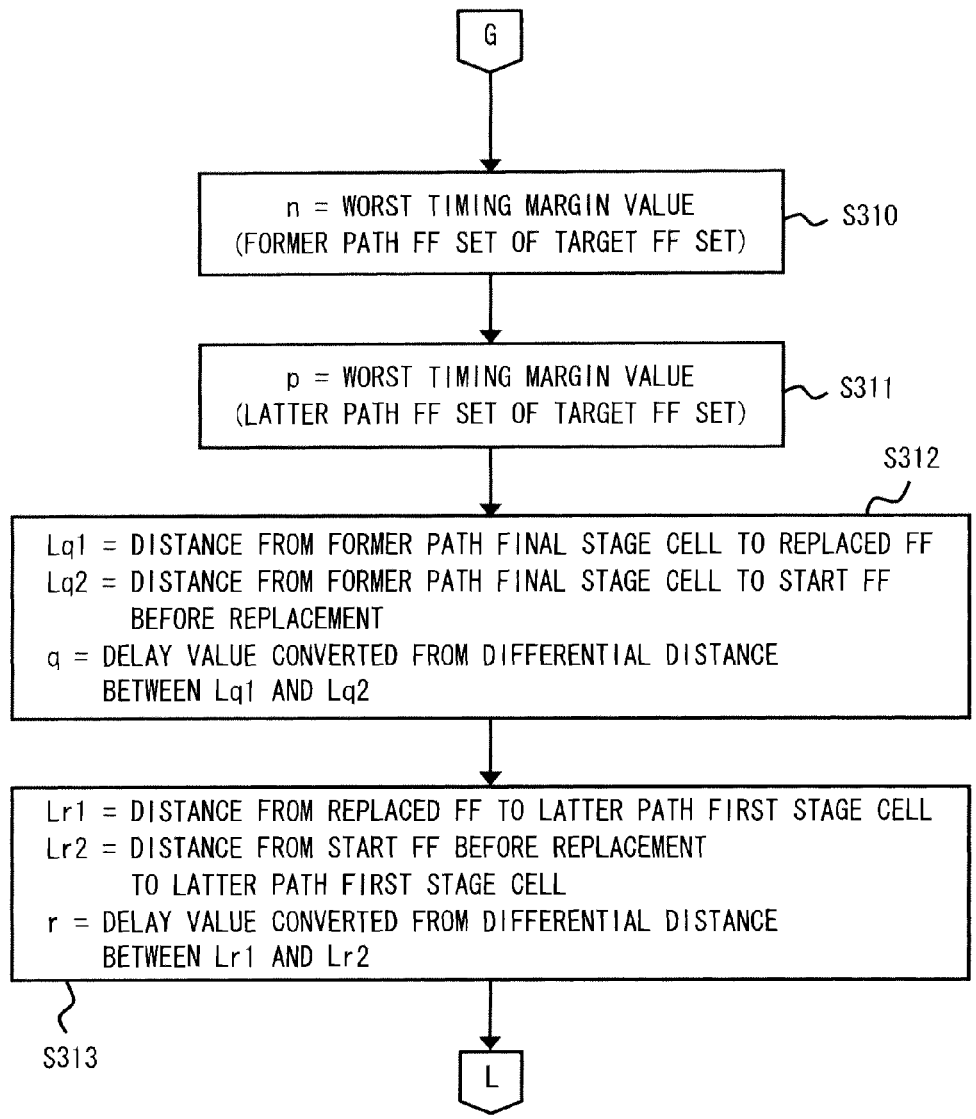
FIG. 9A is a flow chart showing a flow of post-CTS timing analysis processing (3/4) according to the first embodiment of the present invention.
Figure 9B:
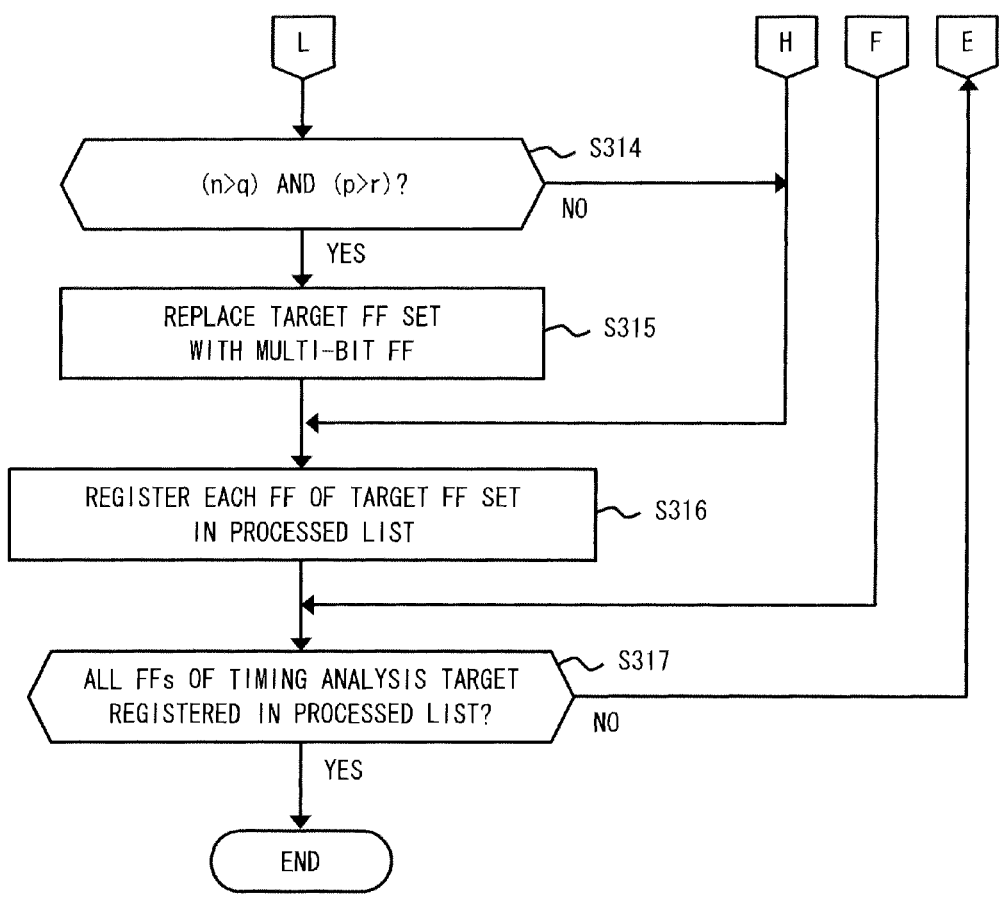
FIG. 9B is a flow chart showing a flow of post-CTS timing analysis processing (4/4) according to the first embodiment of the present invention.
Figure 10:
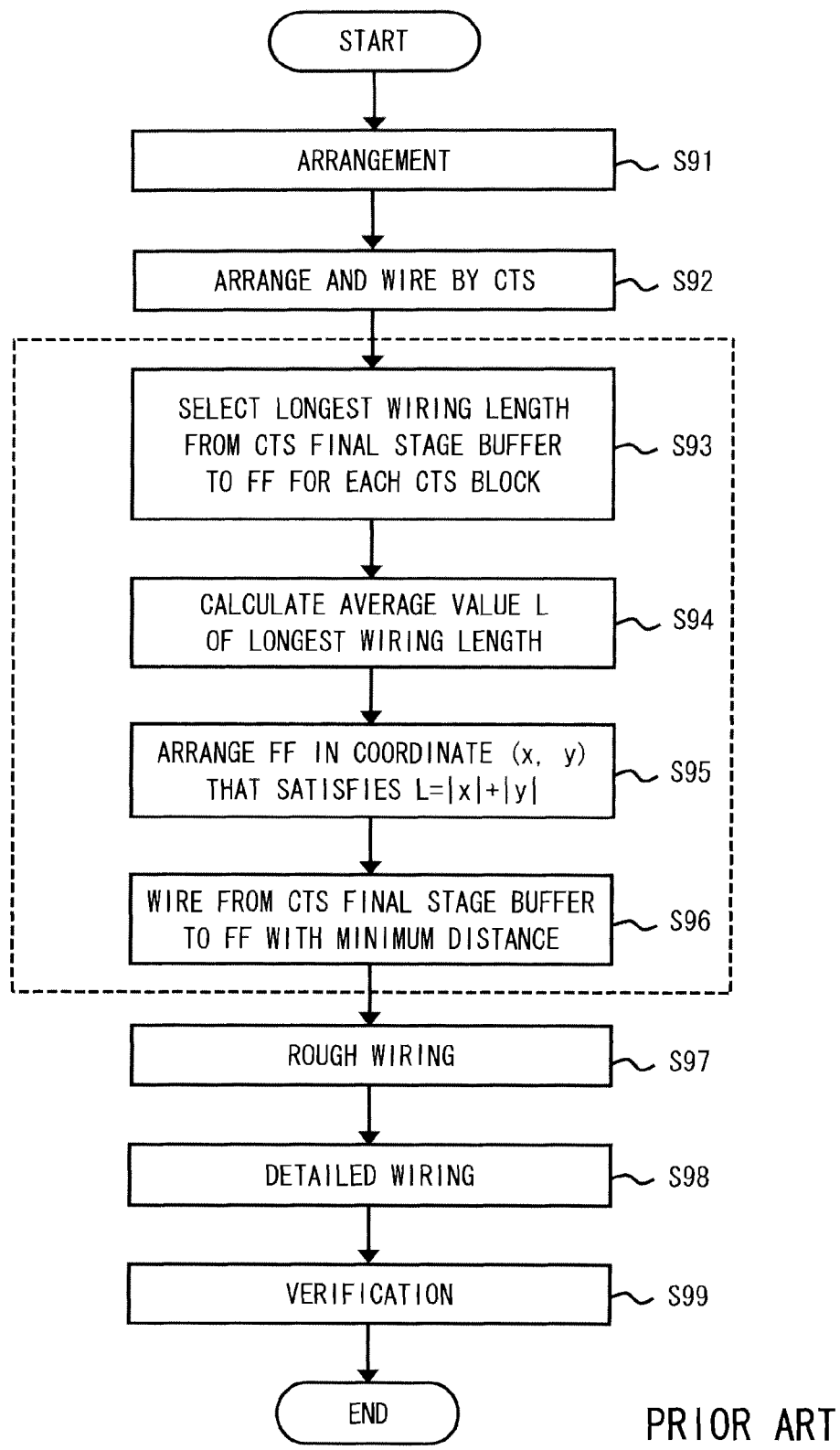
FIG. 10 is a flow chart showing a flow of processing of a layout method of a semiconductor integrated circuit according to a related art.
Figure 11:
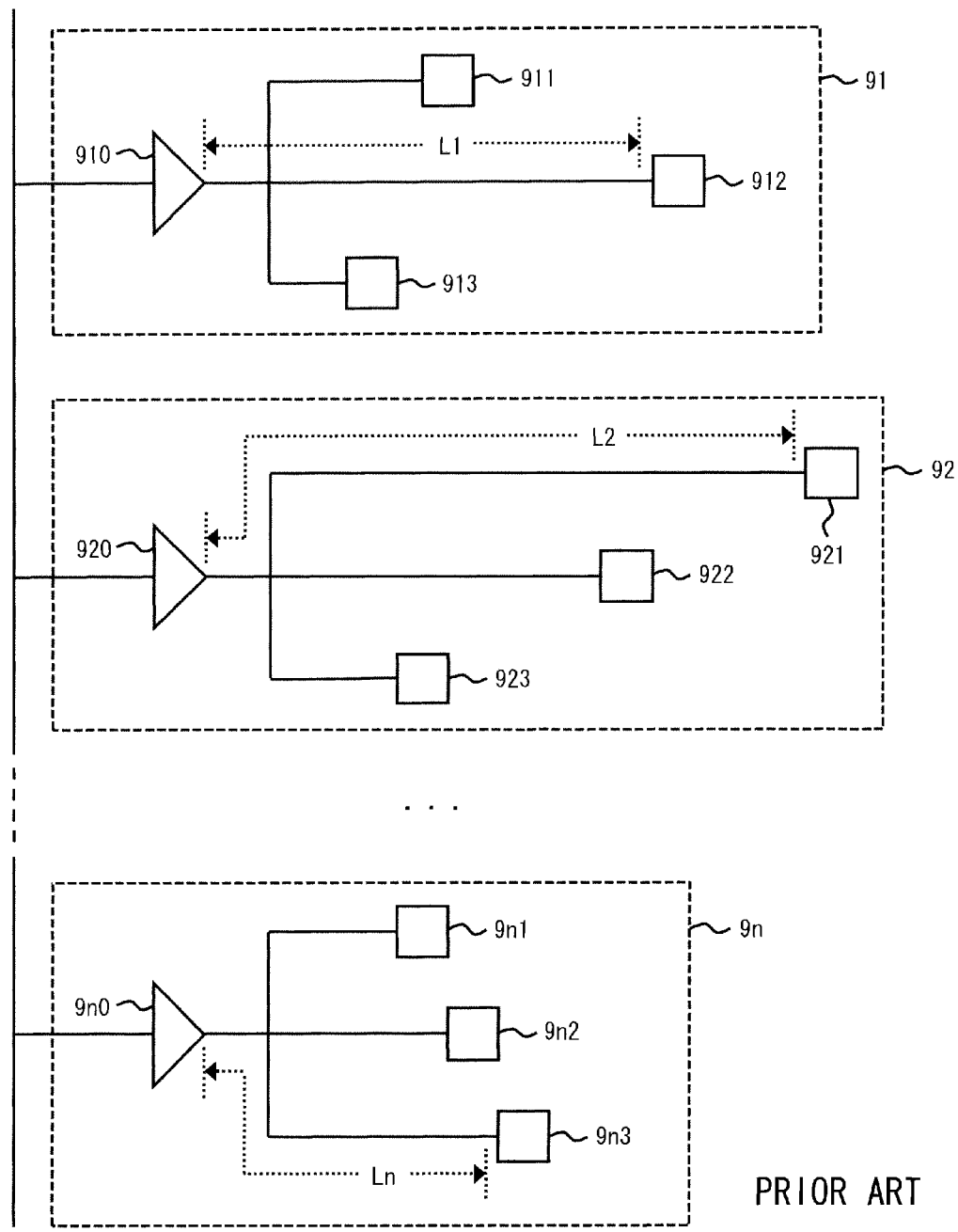
FIG. 11 is a diagram showing an example of a circuit diagram after the CTS process in the layout method of the semiconductor integrated circuit according to the related art.
Figure 12:
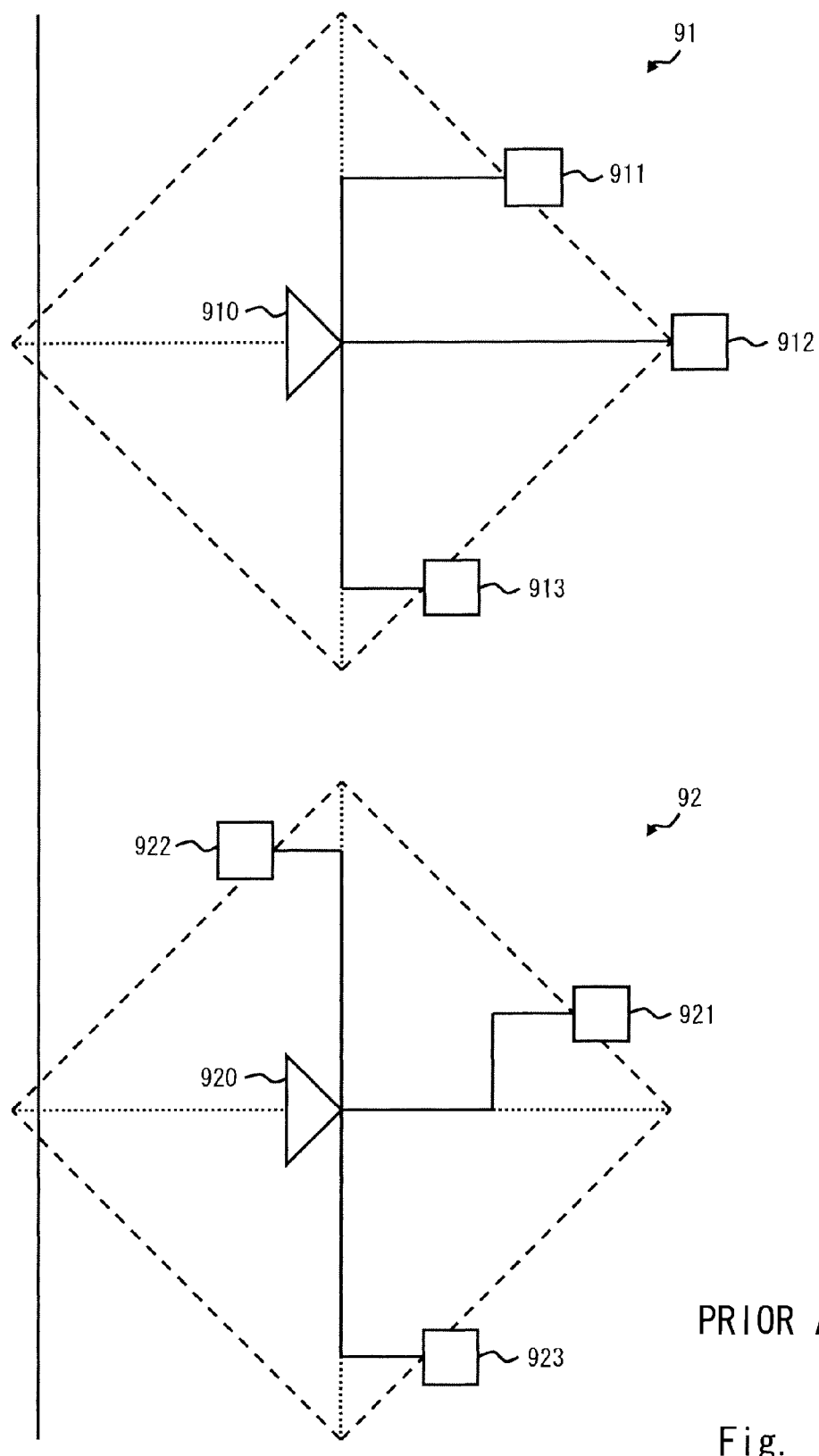
FIG. 12 is a diagram describing a concept of an arrangement in the layout method of the semiconductor integrated circuit according to the related art.
Figure 13:
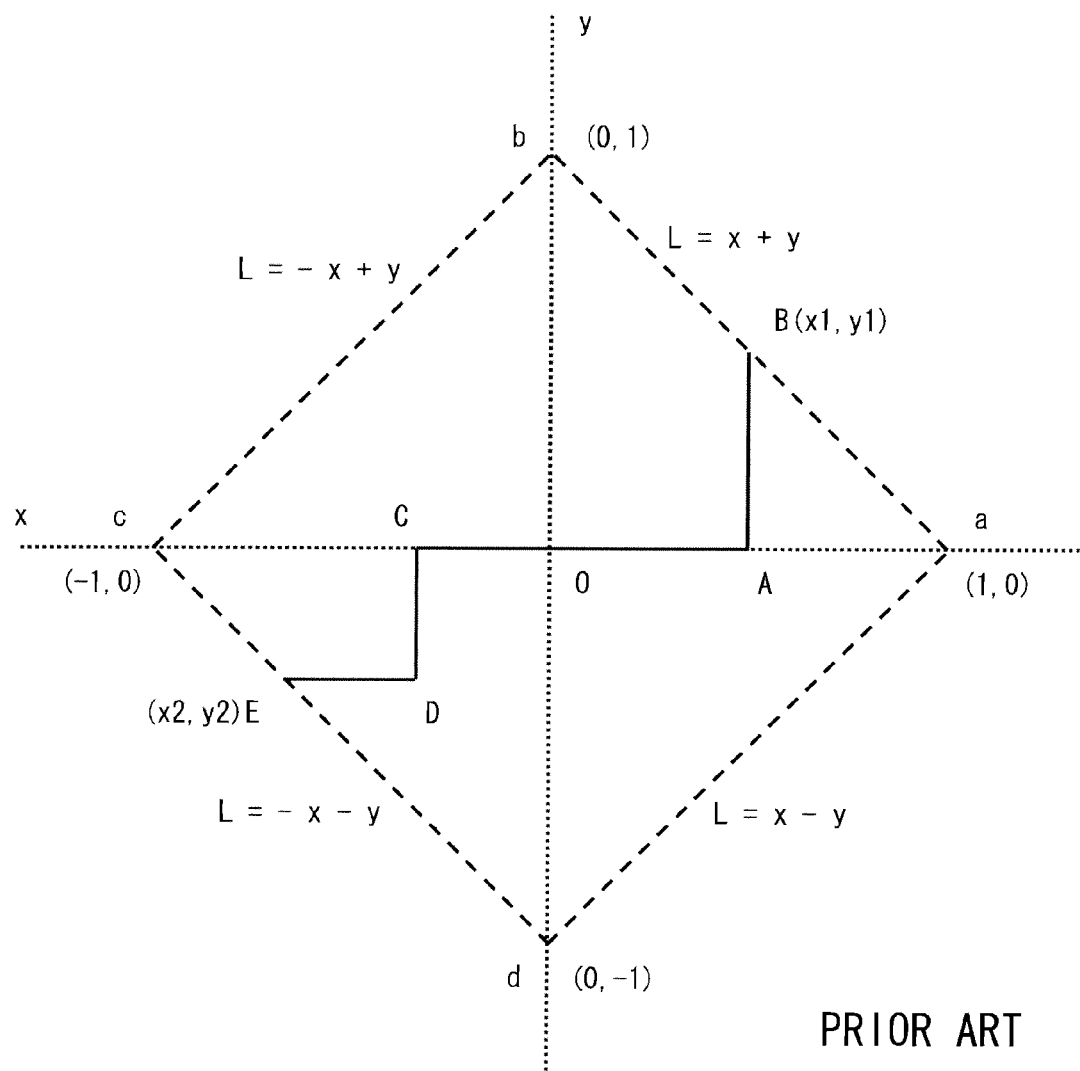
FIG. 13 is a diagram describing a concept of the arrangement in the layout method of the semiconductor integrated circuit according to the related art.

FIG. 5 is a flow chart showing a process flow of the layout method of the semiconductor integrated circuit according to the first embodiment of the present invention. In this example, it is assumed that N (N is an integer of three or larger) pieces of flip-flop circuits have already been arranged and wired in the semiconductor integrated circuit 200 in advance.

First, the layout device 10 executes pre-CTS timing analysis processing (S11). Specifically, the layout device 10 selects M (M is an integer of two or larger and N or smaller) pieces of sequential circuits among N flip-flop circuits of the layout target before executing CTS. Then the layout device 10 replaces the M pieces of sequential circuits that are selected with one multi-bit FF circuit including M pieces of input terminals and output terminals and one clock terminal.

More specifically, the layout device 10 selects the target FF set including the combination of two FFs which is the target of timing analysis processing based on the arrangement information of a plurality of flip-flop circuits mounted on the semiconductor integrated circuit 200. Then, the layout device 10 judges whether the target FF set that is selected can be replaced with a multi-bit FF circuit. For example, it is assumed that the layout device 10 replaces the target FF set that is selected with the multi-bit FF circuit. Then, the layout device 10 judges whether there is caused a timing error in consideration of the arrangement moving distance when the above assumption is made. When it is judged that the replacement can be performed, or when there is no timing error, the layout device 10 replaces the target FF set that is selected with one multi-bit FF circuit.

In summary, in step S11, the layout device 10 executes timing verification when it is assumed that the target FF set is replaced with a multi-bit FF circuit for a former-stage path and a latter-stage path of each of the M pieces of sequential circuits that are selected using the arrangement information of the M pieces of sequential circuits that are selected and the arrangement information of the multi-bit FF circuit when it is assumed that the replacement is performed. It is preferable that the layout device 10 replaces the target FF set with a multi-bit FF circuit when there is no timing error for all the former-stage paths and the latter-stage paths in which timing verification is executed. Accordingly, it is possible to specify the target FF set that should be replaced with the multi-bit FF circuit with more accuracy, and the effect can be enhanced by the replacement.

Further, in step S11, the layout device 10 may execute timing analysis for N pieces of sequential circuits, select a part or all of the sequential circuits in which a timing error is occurred as the M pieces of sequential circuits, and replace the M pieces of sequential circuits that are selected with one multi-bit FF circuit.

Next, the layout device 10 executes CTS based on the arrangement information of the semiconductor integrated circuit 200 in which pre-CTS timing analysis processing is completed (S12).

The layout device 10 then executes post-CTS timing analysis processing (S13). Specifically, the layout device 10 selects a plurality of sequential circuits from sequential circuits which are not replaced in step S11 and the multi-bit FF circuit replaced in step S11 among the N pieces of sequential circuits mounted on the semiconductor integrated circuit 200 after the CTS is executed. Then, the layout device 10 replaces the plurality of sequential circuits that are selected with one multi-bit FF circuit in consideration of the clock skew value after the CTS is executed.

In summary, in step S13, the layout device 10 executes timing verification for the former-stage path and the latter-stage path of each of the M pieces of sequential circuits that are selected further using the clock skew value after the CTS is executed in addition to the processing of step S11.

Further, in step S13, the layout device 10 may calculate the clock skew value after the CTS is executed, select a part or all of the sequential circuits corresponding to the path in which the clock skew value exceeds a predetermined value as the M pieces of sequential circuits, and replace the M pieces of sequential circuits that are selected with one multi-bit FF circuit.

Further, in step S13, the layout device 10 may execute timing verification for the former-stage path and the latter-stage path of each of M pieces of sequential circuits that are selected further using the OCV value of the clock.

Note that the FF set which is to be replaced in steps S11 and S13 is the FF set having the same clock and the synchronous clock.

Subsequently, a flow of the pre-CTS timing analysis processing in step S11 of FIG. 5 will be described with reference to FIGS. 6A, 6B, 7A, and 7B. FIGS. 6A, 6B, 7A, and 7B are flow charts showing the pre-CTS timing analysis processing (1/4 to 4/4) according to the first embodiment of the present invention.

It is assumed that the RAM 120 stores the information to identify N pieces of FFs mounted on the semiconductor integrated circuit 200 that are the timing analysis target, and the arrangement information including the arrangement coordinates of each FF in advance. At this time, for the sake of convenience of description, it is assumed that the semiconductor integrated circuit 200 is in the state shown in FIG. 3. Further, it is assumed that the area for a processed list to register a combination of FFs that are selected as the timing analysis target and that are already processed is provided in the RAM 120. Note that the combination of FFs is not registered in the processed list at the start of the pre-CTS timing analysis processing. Alternatively, the FFs that are not the target of the timing analysis may be registered in the processed list in advance.

First, the layout device 10 extracts the FF set (start FF and end FF) which is the target of the timing analysis (S201). For example, in FIG. 3, the layout device 10 selects, as the target FF set, the combination of the FF1 as the start FF and the FF4 as the end FF. At the same time, the layout device 10 selects the combination of the FF1 as the start FF and the FF3 as the end FF, and the combination of the FF2 as the start FF and the FF3 as the end FF. In short, three pairs are selected as the target FF sets.

Note that the method of selecting the target FF set may be determined in a desired way. For example, the layout device 10 may receive specification of the region of the dotted lines surrounding the FF1, FF2, FF3, and FF4 of FIG. 3 as the rectangular region of the timing analysis target from an external device in advance, and select the above three target FF sets within the specified region. Alternatively, the layout device 10 may select one of the above three target FF sets from the specified region, and thereafter select any unselected target FF set within the specified region every time step S201 is executed. Alternatively, the layout device 10 may receive a specified region every time step S201 is executed.

Further, the layout device 10 may select a combination of two FFs connected through a cell or a combinational circuit as the target FF set without receiving any specification of the region. The number that composes each target FF set may not necessarily be two. For example, the start FF may be the FF1, and the end FF may be the FF4 and the FF3 connected from the FF1. In this case, the FF1, the FF3, and the FF4 constitute the target FF set. Further, the FF1, the FF2, the FF3, and the FF4 may be selected as the target FF set. In summary, it is only required that at least two or more FFs are selected from all the FFs mounted on the semiconductor integrated circuit 200.

Next, the layout device 10 judges whether each FF of the target FF set is unregistered in the processed list (S202). Specifically, the layout device 10 refers to the processed list stored in the RAM 120, and judges whether each FF of the target FF set extracted in step S201 is registered.

When it is judged in step S202 that each FF is registered in the processed list, the process goes to step S217 described later. When it is judged in step S202 that each FF is unregistered in the processed list, the layout device 10 judges whether there is a timing error in the target FF set (S203). In summary, the layout device 10 judges whether there is a timing error between the start FF and the end FF of the target FF set in the location in which FFs are arranged in the semiconductor integrated circuit 200 before the start of the timing analysis processing.

When it is judged in step S203 that there is a timing error, the layout device 10 substitutes a worst timing error value into the RAM 120 as a variable a according to the following expression (51) (S204).

$$a = \text{worst timing error value} \tag{51}$$

When it is judged in step S203 that there is no timing error, the layout device 10 substitutes the worst timing margin value, or a timing margin value, into the RAM 120 as the variable a according to the following expression (52) (S205).

$$a = \text{worst timing margin value} \tag{52}$$

Thereafter, the layout device 10 registers the arrangement position when it is assumed that the target FF set is replaced with the multi-bit FF (replaced FF) (S206). Specifically, the layout device 10 determines the intermediate position between the start FF and the end FF of the target FF set as the arrangement position after the replacement, and registers in the RAM 120 the arrangement position that is determined. For example, when it is assumed that the FF1, the FF2, the FF3, and the FF4 in FIG. 3 are replaced with the FF1$e$ which is the replaced FF, the layout device 10 registers the arrangement position of the FF1$e$. Although any method may be used to determine the arrangement position after the replacement, the specific example will be described later.

Subsequently, the layout device 10 calculates a delay value for the latter-stage path of the replaced FF (S207). Specifically, the layout device 10 first calculates distances $Lb1$ and $Lb2$ according to the following expressions (61) and (62). Then, the layout device 10 calculates a delay value b according to the following expression (63).

$$Lb1 = \text{distance from the replaced } FF \text{ to the latter-stage cell} \tag{61}$$

$$Lb2 = \text{distance from the start } FF \text{ before replacement to the latter-stage cell} \tag{62}$$

$$b = \text{delay value converted from differential distance between } Lb1 \text{ and } Lb2 \tag{63}$$

For example, when it is assumed that the target FF set is the FF1 and the FF4 and is replaced with the FF1$e$, the layout device 10 first calculates "distance LB1+distance LB2", which is the distance from the output terminal OUT1 of the FF1$e$ to the cell 11, as the distance Lb1. Further, the layout device 10 calculates the distance LB, which is the distance from the output terminal OUT1 of the FF1 to the cell 11, as the distance Lb2. Then, the layout device 10 calculates the differential distance between the distance Lb1 and the distance Lb2. Then, the layout device 10 calculates the delay value b by converting the influence by the differential distance to the delay time, and registers the delay value b in the RAM 120.

Next, the layout device 10 calculates the delay value for the former-stage path (S208). Specifically, the layout device 10 first calculates distances Lc1 and Lc2 according to the following expressions (71) and (72). The layout device 10 then calculates a delay value c according to the following expression (73).

$$Lc1 = \text{distance from the former-stage cell to the replaced } FF \tag{71}$$

$$Lc2 = \text{distance from the former-stage cell to the end } FF \text{ before replacement} \tag{72}$$

$$c = \text{delay value converted from differential distance between } Lc1 \text{ and } Lc2 \tag{73}$$

For example, when it is assumed that the target FF set is the FF1 and the FF4 and is replaced with the FF1$e$, the layout device 10 first calculates "distance LD1+distance LD2", which is the distance from the cell 14 to the input terminal DATA4 of the FF1$e$, as the distance Lc1. Further, the layout device 10 calculates the distance LD, which is the distance from the cell 14 to the input terminal DATA4 of the FF4, as the distance Lc2. The layout device 10 then calculates the differential distance from the distance Lc1 to the distance Lc2. Then, the layout device 10 calculates the delay value c by converting the influence by the differential distance to the delay time, and registers the delay value c in the RAM 120.

Note that the delay value b and the delay value c are calculated and registered also when the target FF set is the FF1 and the FF3, and the FF2 and the FF3.

The layout device 10 now judges whether there is no timing error including the amount of change in delay generated in the moving distance of the arrangement position according to the replacement with the multi-bit FF circuit (S209). Specifically, the layout device 10 judges whether the variable a is larger than "delay value b+delay value c". When it is judged in step S209 that there is a timing error, the process goes to step S216.

When it is judged in step S209 that there is no timing error, the layout device 10 substitutes the worst timing margin value of the former path FF set which is the FF set having the start FF of the target FF set as the end FF into the RAM 120 as a variable d according to the following expression (81) (S210).

$$d = \text{worst timing margin value} \tag{81}$$

For example, when the target FF set is the FF1 and the FF4, the FF 1 which is the start FF becomes the end FF. Thus, the former path FF set is the FF5 and the FF1. Thus, the worst timing margin value in the FF5 and the FF1 is registered as the variable d.

Then, the layout device 10 substitutes the worst timing margin value of the latter path FF set which is the FF set having the end FF of the target FF set as the start FF into the RAM 120 as a variable e according to the following expression (82) (S211).

$$e = \text{worst timing margin value} \tag{82}$$

For example, when the target FF set is the FF1 and the FF4, the FF4 which is the end FF becomes the start FF. Thus, the latter path FF set is the FF4 and the FF8. Accordingly, the worst timing margin value in the FF4 and the FF8 is registered as the variable e.

When the target FF set is the FF1 and the FF3, the former path FF set is the FF5 and the FF1, and the latter path FF set is the FF3 and the FF7. Further, when the target FF set is the FF2 and the FF3, the former path FF set is the FF6 and the FF2, and the latter path FF set is the FF3 and the FF7. Also in these cases, the variable d and the variable e are calculated and registered.

Subsequently, the layout device 10 calculates the delay value based on the worst timing margin value of the former path FF set of the target FF set registered in step S210 (S212). Specifically, the layout device 10 first calculates distances Lf1 and Lf2 according to the following expressions (91) and (92). Then, the layout device 10 calculates a delay value f according to the following expression (93).

$Lf1$=distance from the former path final stage cell to the replaced $FF$ (91)

$Lf2$=distance from the former path final stage cell to the start $FF$ before replacement (92)

$f$=delay value converted from differential distance between $Lf1$ and $Lf2$ (93)

For example, when the former path FF set is the FF5 and the FF1, the layout device 10 first calculates "distance LA+distance LA1+distance LA2", which is the distance from the cell 18 to the input terminal DATA1 of the FF1e, as the distance Lf1. Further, the layout device 10 calculates the distance LA, which is the distance from the cell 18 to the input terminal DATA 1 of the FF1, as the distance Lf2. Then, the layout device 10 calculates the differential distance between the distance Lf1 and the distance Lf2. The layout device 10 then calculates the delay value f by converting the influence due to the differential distance to the delay time, and registers the delay value f in the RAM 120.

Next, the layout device 10 calculates the delay value based on the worst timing margin value of the latter path FF set of the target FF set registered in step S211 (S213). More specifically, the layout device 10 first calculates distances Lg1 and Lg2 according to the following expressions (101) and (102). Then, the layout device 10 calculates the delay value g according to the following expression (103).

$Lg1$=distance from the replaced $FF$ to the latter path first stage cell (101)

$Lg2$=distance from the start $FF$ before replacement to the latter path first stage cell (102)

$g$=delay value converted from differential distance between $Lg1$ and $Lg2$ (103)

For example, when the latter path FF set is the FF4 and the FF8, the layout device 10 first calculates "distance LE1+distance LE2+distance LE", which is the distance from the output terminal OUT4 of the FF1e to the cell 19, as the distance Lg1. Further, the layout device 10 calculates the distance LE, which is the distance from the output terminal OUT4 of the FF4 to the cell 19, as the distance Lg2. Then, the layout device 10 calculates the differential distance between the distance Lg1 and the distance Lg2. Then, the layout device 10 calculates the delay value g by converting the influence by the differential distance to the delay time, and registers the delay value g in the RAM 120.

Also when the target FF set is the FF1 and the FF3, and the FF2 and the FF3, the delay value f and the delay value g are calculated and registered in the similar way for each of the former path FE set and the latter path FF set.

Then, the layout device 10 judges whether there is no timing error including the amount of change in delay caused by the moving distance of the arrangement position according to the replacement with the multi-bit FF circuit (S214). Specifically, the layout device 10 judges whether the variable d is larger than the delay value f and the variable e is larger than the delay value g. When it is judged in step S214 that there is a timing error, the process goes to step S216.

When it is judged in step S214 that there is no timing error, the layout device 10 replaces the target FF set with the multi-bit FF circuit (S215). Specifically, the layout device 10 deletes the arrangement information of the target FF set in the RAM 120, and registers the arrangement position of the multi-bit FF circuit registered in step S206 as the arrangement information.

The layout device 10 then registers each FF of the target FF set in the processed list (S216). Specifically, the layout device 10 registers the identification information of each FF of the target FF set selected in step S201 in the RAM 120.

The layout device 10 then judges whether all the FFs of the timing analysis target are registered in the processed list (S217). When it is judged that there is an unregistered FF, the process goes to step S201. When it is judged in step S217 that all the FFs have already been registered in the processed list, the pre-CTS timing analysis processing is completed.

Subsequently, the flow of the post-CTS timing analysis processing in step S13 of FIG. 5 will be described with reference to FIGS. 8A, 8B, 9A, and 9B. FIGS. 8A, 8B, 9A, and 9B are flow charts showing the post-CTS timing analysis processing (1/4 to 4/4) according to the first embodiment of the present invention. In the following description, the detailed explanation of same processing as shown in FIGS. 6A, 6B, 7A, and 7B is omitted as appropriate.

Now, when a plurality of FFs are replaced with the multi-bit FF circuit in step S11 of FIG. 5, the arrangement information in each FF in FIG. 4 is the target of the post-CTS timing analysis processing. Further, when a plurality of FFs are not replaced with the multi-bit FF circuit in step S11 of FIG. 5, the arrangement information in each FF in FIG. 3 is the target of the post-CTS timing analysis processing. In the following description, it is assumed that the semiconductor integrated circuit 200 is in the state shown in FIG. 3, for the sake of convenience of description.

It is assumed that the information to identify the plurality of FFs mounted on the semiconductor integrated circuit 200 that are the post-CTS timing analysis target described above and the arrangement information including the arrangement coordinate of each FF are stored in the RAM 120 in advance. Further, it is assumed that the area of the processed list to register the combination of FFs that are selected as the timing analysis target and that have already been processed is kept in the RAM 120. It is assumed that, at the start of the post-CTS timing analysis processing, the combination of FFs is not registered in the processed list. Alternatively, the FFs that are not the target of the timing analysis may be registered in the processed list in advance.

First, the layout device 10 extracts the FF set of the timing analysis target (start FF and end FF) similarly to step S201 (S301). Note that, the multi-bit FF circuit after replacement in step S11 of FIG. 5 may be included in the extracted target FF set as the start FF or the end FF.

Next, steps S302 and S303 are executed as is similar to steps S202 and S203. When it is judged in step S303 that there is a timing error, the layout device 10 substitutes the worst timing error value into the RAM 120 as a variable h according to the following expression (111), and substitutes the clock skew value into the RAM 120 as a variable j according to the following expression (112) (S304).

$h$=worst timing error value (111)

$j$=clock skew value=clock delay value of end $FF$−clock delay value of start $FF$ (112)

For example, when the target FF set is the FF1 and the FF4, the clock delay value of the end FF is the clock delay value that is obtained from the result of executing the CTS in step S12 of FIG. 5 from the clock input terminal CLK0 to the clock input terminal CLK4 of the FF4. Similarly, the clock delay value of the start FF is the clock delay value from the clock input terminal CLK0 to the clock input terminal CLK1 of the FF1.

When it is judged in step S303 that there is no timing error, the layout device 10 substitutes the worst timing margin value into the RAM 120 as the variable h according to the following expression (113), and substitutes the clock skew value into the RAM 120 as the variable j according to the following expression (112) (S305).

$h$=worst timing margin value (113)

Thereafter, the layout device 10 registers the arrangement position when it is assumed that the target FF set is replaced with the multi-bit FF (replaced FF) similarly to step S206 (S306).

Subsequently, the layout device 10 calculates the delay value for the latter-stage path of the replaced FF similarly to step S207 (S307). Specifically, the layout device 10 first calculates distances Lk1 and Lk2 according to the following expressions (121) and (122). Then, the layout device 10 calculates a delay value k according to the following expression (123).

$Lk1$=distance from the replaced $FF$ to the latter-stage cell (121)

$Lk2$=distance from the start $FF$ before replacement to the latter-stage cell (122)

$k$=delay value converted from differential distance between $Lk1$ and $Lk2$ (123)

Next, the layout device 10 calculates the delay value for the former-stage path similarly to step S208 (S308). Specifically, the layout device 10 first calculates distances Lm1 and Lm2 according to the following expressions (131) and (132). Then the layout device 10 calculates a delay value m according to the following expression (133).

$Lm1$=distance from the former-stage cell to the replaced $FF$ (131)

$Lm2$=distance from the former-stage cell to the end $FF$ before replacement (132)

$m$=delay value converted from differential distance between $Lm1$ and $Lm2$ (133)

Now, the layout device 10 judges whether there is no timing error in consideration of the amount of change in delay and the clock delay value that are generated by the moving distance of the arrangement position due to the replacement with the multi-bit FF circuit (S309). Specifically, the layout device 10 judges whether "variable h−variable j which is the clock skew value" is larger than "delay value k+delay value m". When it is judged in step S309 that there is a timing error, the process goes to step S316.

When it is judged in step S309 that there is no timing error, as is similar to step S210, the layout device 10 substitutes the worst timing margin value of the former path FF set having the start FF of the target FF set as the end FF into the RAM 120 as a variable n according to the following expression (141) (S310).

$n$=worst timing margin value (141)

The layout device 10 then substitutes the worst timing margin value of the latter path FF set which is the FF set having the end FF of the target FF set as the start FF into the RAM 120 as a variable p according to the following expression (142), as is similar to step S211 (S311).

$p$=worst timing margin value (142)

Subsequently, the layout device 10 calculates the delay value based on the worst timing margin value of the former path FF set of the target FF set registered in step S310 similarly to step S212 (S312). More specifically, the layout device 10 first calculates distances Lq1 and Lq2 according to the following expressions (151) and (152). Then, the layout device 10 calculates a delay value q according to the following expression (153).

$Lq1$=distance from the former path final stage cell to the replaced $FF$ (151)

$Lq2$=distance from the former path final stage cell to the start $FF$ before replacement (152)

$q$=delay value converted from differential distance between $Lq1$ and $Lq2$ (153)

Next, the layout device 10 calculates the delay value based on the worst timing margin value of the latter path FF set of the target FF set registered in step S311, similarly to step S213 (S313). Specifically, the layout device 10 first calculates distances Lr1 and Lr2 according to the following expressions (161) and (162). Then, the layout device 10 calculates a delay value r according to the following expression (163).

$Lr1$=distance from the replaced $FF$ to the latter path first stage cell (161)

$Lr2$=distance from the start $FF$ before replacement to the latter path first stage cell (162)

$r$=delay value converted from differential distance between $Lr1$ and $Lr2$ (163)

Now, the layout device 10 judges whether there is no timing error including the amount of change in delay caused by the moving distance of the arrangement position according to the replacement with the multi-bit FF circuit as is similar to step S214 (S314). Specifically, the layout device 10 judges whether the variable n is larger than the delay value q and the variable p is larger than the delay value r. When it is judged in step S314 that there is a timing error, the process goes to step S316.

When it is judged in step S314 that there is no timing error, the layout device 10 replaces the target FF set with the multi-bit FF circuit similarly to step S215 (S315). Specifically, the layout device 10 deletes the arrangement information of the target FF set in the RAM 120, and registers the arrangement position of the multi-bit FF circuit registered in step S306 as the arrangement information.

Then, the layout device 10 registers each FF of the target FF set in the processed list similarly to step S216 (S316). Specifically, the layout device 10 registers the identification information of each FF of the target FF set selected in step S301 in the RAM 120.

Then, the layout device 10 judges whether all the FFs that are the timing analysis target are registered in the processed list similarly to step S217 (S317). When it is judged that there is an unregistered FF, the process goes to step S301. When it is judged in step S317 that all the FFs have been registered in the processed list, the post-CTS timing analysis processing is completed.

Now, a specific example of a method of determining the arrangement position after the replacement according to the first embodiment of the present invention will be described. In this example, the target is the path from the FF5 to the FF8 through the cell 1 the FF1, the cell 11, the cell 14, the FF4, and the cell 19 shown in FIG. 3.

In this case, when the target FF set is the FF1 and the FF4, the arrangement position of the FF1e which is the multi-hit FF circuit can be determined as follows. For example, when the timing information including the timing error value or the timing margin value is not considered, the arrangement position of the FF1e is preferably in the intermediate position of the path from the cell 18 to the cell 19 through the cell 11 and the cell 14. On the other hand, when there is timing information, the arrangement position is preferably in the position in which timing convergence is possible based on the timing information from the FF5 to the FF1, the timing information from the FF1 to the FF4, and the timing information from the FF4 to the FF8. In summary, in this case, it is preferable that the multi-bit FF circuit is arranged in the position of the distance ratio in which the timing margin value from the FF5 to the FF1, the timing margin value from the FF1 to the FF4 and the timing margin value from the FF4 to the FF8 are the same based on the above intermediate locations.

For example, when the distance of the path from the cell 18 to the cell 19 is 3 mm, the intermediate distance is 1.5 mm. In this case, when the timing margin value from the FF5 to the FF1 is 1 ns, and the timing margin value from the FF4 to the FF8 is 2 ns, the distance from the cell 18 to the FF1e is preferably 1 mm, and the distance from the FF1e to the cell 19 is preferably 2 mm.

In this case, when the timing margin value from the FF1 to the FF4 is −1 ns, which means there is no timing margin, the timing convergence may be occurred by reducing the distance from the FF1 to the cell 11 and the distance from the cell 14 to the FF4. Accordingly, it is preferable that the timing error position is specified.

Note that the timing margin of the former-stage path or the latter-stage path may not necessarily be plus. For example, when the timing margin value from the FF5 to the FF1 is −1 ns, which means there is no timing margin, and the timing margin value from the FF4 to the FF8 is 2 ns, the distance from the cell 18 to the FF1e is preferably set to 0 mm, which means that it is preferable that the FF1e is adjacent to the cell 18, and the distance from the FF1e to the cell 19 is set to 3 mm. Note that the method of determining the arrangement position after replacement according to the first embodiment of the present invention is not limited to one described above.

From the description above, the first effect of the first embodiment of the present invention is that the timing convergence is improved by making the clock skew value closer to zero. The reason is as follows. First, the technique related to Japanese Unexamined Patent Application Publication No. 2000-348083 is to set the clock wiring length to the average value. Thus, as described above, it is impossible to completely converge the timing error due to the influence of the clock skew. Meanwhile, according to the first embodiment of the present invention, a plurality of FFs are replaced with a multi-bit FF circuit having the same clock structure. Accordingly, there is no difference in the clock delay time between FFs that are the target of the timing analysis. Thus, the clock skew can be made close to zero. Accordingly, it is possible to set the path which is judged to be timing error due to the influence of the clock skew to the positive timing slack.

The second effect of the first embodiment of the present invention is that the timing convergence is improved by making the OCV (On Chip Variation), which is the relative variation component, closer to zero. The reason is as follows. First, according to the first embodiment of the present invention, the path which is the negative timing slack due to the influence of the OCV is replaced with the multi-bit FF circuit having the same clock structure. Therefore, there is no clock branch point between the FFs that are the target of the timing analysis. Thus, the OCV can be made closer to zero. Accordingly, it is possible to make the path which is judged to be timing error due to the influence of the OCV positive timing slack.

The third effect of the first embodiment of the present invention is that the area can be reduced. The reason is as follows. First, according to the first embodiment of the present invention, a combination of FFs is replaced with a multi-bit FF circuit having the same clock structure. Accordingly, the transistor circuit of the clock that exists in each FF is replaced by one transistor circuit. Thus, the area of the FF itself can be reduced. Further, according to Japanese Unexamined Patent Application Publication No. 2000-348083, each FF has a CTS tree. Meanwhile, according to the first embodiment of the present invention, a combination of FFs is replaced with a multi-bit FF circuit. Thus, the CTS tree is integrated, and the area corresponding to the CTS tree buffer can be reduced.

The fourth effect of the first embodiment of the present invention is that power consumption can be reduced. The reason is as follows. According to Japanese Unexamined Patent Application Publication No. 2000-348083 the electric power is consumed in each FF since each clock circuit in each FF operates. Meanwhile, according to the first embodiment of the present invention, since a combination of FFs is replaced with a multi-hit FF circuit having the same clock structure, only one clock circuit is operated. Accordingly, it is possible to share the clock circuit and operate multi hits as one circuit. Accordingly, the power consumption of the FF itself can be reduced by the amount of integration of FFs. Further, according to Japanese Unexamined Patent Application Publication No. 2000-348083, each FF has a CTS tree. Meanwhile, according to the first embodiment of the present invention, by replacement with the multi-bit FF circuit, the CTS tree is integrated and the power consumption corresponding to the buffer in the CTS tree is reduced.

<Other Embodiments>

The present invention can be summarized as follows. In summary, the present invention relates to a layout method of a semiconductor integrated circuit including performing replacement with a multi-bit FF circuit, any replacement target FF set being the same clock and synchronous clock, the method including a means to judge the distance before and after the replacement of the multi-bit FF circuit after arrangement before CTS is executed, so as to perform replacement with the multi-bit FF circuit, and a means to perform replacement with the multi-bit FF circuit judging from the distance and the clock delay before and after the multi-bit FF circuit replacement after execution of CTS. Accordingly, the clock skew can be made closer to zero by replacing the path which is the negative timing slack due to the influence of the clock skew with the multi-bit FF circuit having the same clock structure. Further, it is possible to make the path which is judged to be timing error due to the influence of the clock skew (or the influence of OCV) positive timing slack, and to improve timing convergence by making the clock skew close to zero.

In addition to the description above, it is preferable that the present invention includes a means to judge whether the delay value converted from the distance is within the range of the timing margin in the timing analysis before the CTS is executed.

In addition to the description above, it is preferable that the present invention includes a means to convert the differential distance generated by the replacement with the multi-bit FF circuit to the delay, judge whether any target FF set, and a former path FF set and a latter path FF set of the FF set are within the range of the timing margin, and perform replacement with the multi-bit FF circuit.

Further, the present invention may include a means to judge whether any target FF set, and a former path FF set and a latter path FF set of the FF set are at the desired timing from the result of converting the differential distance generated by the replacement with the multi-bit FF circuit to delay and the clock delay, and perform replacement with the multi-hit FF circuit in the timing analysis after the CTS is executed.

In this case, it is further preferable that the present invention includes a means to perform replacement with the multi-bit FF circuit when the difference between the worst timing margin value or the worst timing error value and the clock skew value of any FF set is larger than the total value of the difference obtained by converting the distance before and after the replacement to the delay value.

Alternatively, the present invention may include a means to perform replacement with the multi-bit FF circuit when the difference between the worst timing margin value or the worst timing error value and the OCV value of the clock of any FF set is larger than the total value of the difference obtained by converting the distance before and after the replacement to the delay value.

Further alternatively, the present invention may include a means to perform replacement with the multi-bit FF circuit when the difference between the worst timing margin value or the worst timing error value and the clock skew value and the clock OCV value of any FF set is larger than the total value of the difference obtained by converting the distance before and after the replacement to the delay value.

Although the embodiments above have been explained as the hardware configuration, the present invention is not limited to this. The present invention may achieve desired processing by making a CPU (Central Processing Unit) execute a computer program. In the above examples, the program can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g. magneto-optical disks). CD-ROM (compact disc read only memory), CD-R (compact disc recordable), CD-R/W (compact disc rewritable), DVD (Digital Versatile Disc), BD (Blu-ray™ Disc), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

Needless to say, the present invention is not limited to the embodiments described above, but can be variously changed without departing from the spirit of the present invention described above.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A layout method of a semiconductor integrated circuit, comprising:
   selecting, via a processor, M (M is an integer of two or larger and N or smaller) pieces of sequential circuits from N (N is an integer of three or larger) pieces of sequential circuits mounted on the semiconductor integrated circuit, a clock being distributed to the N pieces of sequential circuits from a same clock route; and
   replacing the M pieces of sequential circuits that are selected with a single multi-data input/output sequential circuit, having a single flip-flop, including M pieces of input terminals and output terminals and a single clock terminal that receives the clock distributed from the clock route.

2. The layout method according to claim 1, comprising:
   executing timing verification when it is assumed that replacement is performed with the multi-data input/output sequential circuit for a former-stage path and a latter-stage path of each of the M pieces of sequential circuits that are selected using arrangement information of the M pieces of sequential circuits that are selected and arrangement information of the multi-data input/output sequential circuit when it is assumed that the replacement is performed; and
   performing replacement with the multi-data input/output sequential circuit when there is no timing error in all the former-stage paths and the latter-stage paths in which the timing verification is executed.

3. The layout method according to claim 2, comprising executing the timing verification for the former-stage path and the latter-stage path of each of the M pieces of sequential circuits that are selected further using a clock skew value after Clock Tree Synthesis (CTS) is executed.

4. The layout method according to claim 2, comprising executing the timing verification for the former-stage path and the latter-stage path of each of the M pieces of sequential circuits that are selected further using an On Chip Variation (OCV) value of a clock.

5. The layout method according to claim 2, comprising:
   executing timing analysis for the N pieces of sequential circuits;
   selecting a part or all of the sequential circuits in which timing error is occurred as the M pieces of sequential circuits; and
   replacing the M pieces of sequential circuits that are selected with the one multi-data input/output sequential circuit.

6. The layout method according to claim 2, comprising:
   selecting the M pieces of sequential circuits from the N pieces of sequential circuits before Clock Tree Synthesis (CTS) is executed;

replacing the M pieces of sequential circuits that are selected with the one multi-data input/output sequential circuit;

executing CTS based on arrangement information after the replacement;

selecting a plurality of sequential circuits from a sequential circuit which is not replaced among the N pieces of sequential circuits and the multi-data input/output sequential circuit which is replaced after the CTS is executed; and replacing the plurality of sequential circuits that are selected with the one multi-data input/output sequential circuit in consideration of a clock skew value after the CTS is executed.

7. The layout method according to claim 3, comprising:
calculating a clock skew value after executing CTS;
selecting a part or all of the sequential circuits corresponding to a path in which the clock skew value exceeds a predetermined value as the M pieces of sequential circuits; and
replacing the M pieces of sequential circuits that are selected with the one multi-data input/output sequential circuit.

8. The layout method according to claim 3, comprising:
executing timing analysis for the N pieces of sequential circuits;
selecting a part or all of the sequential circuits in which timing error is occurred as the M pieces of sequential circuits; and
replacing the M pieces of sequential circuits that are selected with the one multi-data input/output sequential circuit.

9. The layout method according to claim 1, comprising:
executing timing analysis for the N pieces of sequential circuits;
selecting a part or all of the sequential circuits in which timing error is occurred as the M pieces of sequential circuits; and
replacing the M pieces of sequential circuits that are selected with the one multi-data input/output sequential circuit.

10. The layout method according to claim 1, comprising:
selecting the M pieces of sequential circuits from the N pieces of sequential circuits before Clock Tree Synthesis (CTS) is executed;
replacing the M pieces of sequential circuits that are selected with the one multi-data input/output sequential circuit;
executing CTS based on arrangement information after the replacement;
selecting a plurality of sequential circuits from a sequential circuit which is not replaced among the N pieces of sequential circuits and the multi-data input/output sequential circuit after replacement after the CTS is executed; and
replacing the plurality of sequential circuits that are selected with the one multi-data input/output sequential circuit in consideration of a clock skew value after the CTS is executed.

11. The layout method according to claim 1, wherein the single flip-flop is a multi-bit flip-flop.

12. A layout system of a semiconductor integrated circuit using a computer, the computer comprising:
a storage unit configured to store arrangement information of N (N is an integer of three or larger) pieces of sequential circuits mounted on the semiconductor integrated circuit, a clock being distributed to the N pieces of sequential circuits from a same clock route; and
a control unit configured to execute layout of the sequential circuits in the semiconductor integrated circuit, wherein the control unit comprises:
a selection unit configured to select M (M is an integer of two or larger and N or smaller) pieces of sequential circuits from the N pieces of sequential circuits; and
a replacement unit configured to replace the M pieces of sequential circuits that are selected with a single multi-data input/output sequential circuit, having a single flip-flop, including M pieces of input terminals and output terminals and a single clock terminal that receives a clock distributed from the clock route.

13. The layout system according to claim 12, wherein
the control unit further comprises a timing verification unit configured to execute timing verification when it is assumed that replacement is performed with the multi-data input/output sequential circuit for a former-stage path and a latter-stage path of each of the M pieces of sequential circuits that are selected using arrangement information of the M pieces of sequential circuits that are selected and arrangement information of the multi-data input/output sequential circuit when it is assumed that the replacement is performed, and
the replacement unit is configured to perform replacement with the multi-data input/output sequential circuit when there is no timing error in all the former-stage paths and the latter-stage paths in which the timing verification is executed.

14. The layout system according to claim 13, wherein the timing verification unit executes the timing verification for the former-stage path and the latter-stage path of each of the M pieces of sequential circuits that are selected further using a clock skew value after Clock Tree Synthesis (CTS) is executed.

15. The layout system according to claim 14, wherein
the control unit further comprises a calculation unit configured to calculate a clock skew value after Clock Tree Synthesis (CTS) is executed,
the selection unit configured to select a part or all of the sequential circuits corresponding to a path in which the clock skew value exceeds a predetermined value as the M pieces of sequential circuits, and
the replacement unit configured to replace the M pieces of sequential circuits that are selected with the one multi-data input/output sequential circuit.

16. The layout system according to claim 12, wherein the control unit further comprises a timing analysis unit configured to execute timing analysis for the N pieces of sequential circuits, the selection unit configured to select a part or all of the sequential circuits in which timing error is occurred as the M pieces of sequential circuits, and the replacement unit configured to replace the M pieces of sequential circuits that are selected with the one multi-data input/output sequential circuit.

17. The layout system according to claim 12, wherein the single flip-flop is a multi-bit flip-flop.

18. A non-transitory computer readable medium storing a layout program of a semiconductor integrated circuit that makes a computer execute processing including:
selection processing that selects M (M is an integer of two or larger and N or smaller) pieces of sequential circuits from N (N is an integer of three or larger) pieces of sequential circuits mounted on the semiconductor integrated circuit, a clock being distributed to the N pieces of sequential circuits from a same clock route; and replacement processing that replaces the M pieces of sequential circuits that are selected with a single multi-data input/output sequential circuit, having a single flip-flop, including M pieces of input terminals and output terminals and a single clock terminal that receives the clock distributed from the clock route.

19. The non-transitory computer readable medium storing the layout program according to claim 18, further comprising:
    timing verification processing that executes timing verification when it is assumed that replacement is performed with the multi-data input/output sequential circuit for a former-stage path and a latter-stage path of each of the M pieces of sequential circuits that are selected using arrangement information of the M pieces of sequential circuits that are selected and arrangement information of the multi-data input/output sequential circuit when it is assumed that the replacement is performed;
    wherein the replacement processing performs replacement with the multi-data input/output sequential circuit when there is no timing error in all the former-stage paths and the latter-stage paths in which the timing verification is executed.

20. The non-transitory computer readable medium storing the layout program according to claim 19, wherein the timing verification processing executes the timing verification for the former-stage path and the latter-stage path of each of the M pieces of sequential circuits that are selected further using a clock skew value after Clock Tree Synthesis (CTS) is executed.

21. The non-transitory computer readable medium storing the layout program according to claim 20, further comprising a calculation processing that calculates a clock skew value after the CTS is executed, wherein
    the selection processing selects a part or all of the sequential circuits corresponding to a path in which the clock skew value exceeds a predetermined value as the M pieces of sequential circuits, and
    the replacement processing replaces the M pieces of sequential circuits that are selected with the one multi-data input/output sequential circuit.

22. The non-transitory computer readable medium storing the layout program according to claim 18, further comprising timing analysis processing that executes timing analysis for the N pieces of sequential circuits; wherein
    the selection processing selects a part or all of the sequential circuits in which timing error is occurred by the timing analysis processing as the M pieces of sequential circuits, and
    the replacement processing replaces the M pieces of sequential circuits that are selected with the one multi-data input/output sequential circuit.

23. The non-transitory computer readable medium storing the layout program according to claim 18, wherein the single flip-flop is a multi-bit flip-flop.

* * * * *